US012693111B2

(12) United States Patent 
Ogasawara et al.

(10) Patent No.: US 12,693,111 B2 
(45) Date of Patent: Jul. 28, 2026

(54) KEY DEPRESSION AMOUNT SENSOR DEVICE

(71) Applicant: Sony Group Corporation, Tokyo (JP)

(72) Inventors: Yuki Ogasawara, Tokyo (JP); Hayato Nishioka, Tokyo (JP); Shinichi Furuya, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 85 days.

(21) Appl. No.: 18/842,596

(22) PCT Filed: Mar. 24, 2023

(86) PCT No.: PCT/JP2023/011903
§ 371 (c)(1), 
(2) Date: Aug. 29, 2024

(87) PCT Pub. No.: WO2023/190197
PCT Pub. Date: Oct. 5, 2023

(65) Prior Publication Data
US 2025/0172382 A1 May 29, 2025

(30) Foreign Application Priority Data
Mar. 31, 2022 (JP) ................................. 2022-059430

(51) Int. Cl.
| | |
|---|---|
| *G01B 11/14* | (2006.01) |
| *G10H 1/34* | (2006.01) |
| *H05K 1/181* | (2026.01) |

(52) U.S. Cl.
CPC ............. *G01B 11/14* (2013.01); *G10H 1/344* (2013.01); *G10H 2220/221* (2013.01);
(Continued)

(58) Field of Classification Search
CPC .. G01B 11/14; G10H 1/344; G10H 2220/221; G10H 2220/275;
(Continued)

(56) References Cited

U.S. PATENT DOCUMENTS

| | | |
|---|---|---|
| 4,351,221 A | 9/1982 | Starnes |
| 4,768,412 A | 9/1988 | Sanderson |
| | (Continued) | |

FOREIGN PATENT DOCUMENTS

| | | |
|---|---|---|
| CN | 1457036 A | 11/2003 |
| CN | 204390723 U | 6/2015 |
| | (Continued) | |

*Primary Examiner* — Md M Rahman 
(74) *Attorney, Agent, or Firm* — Paratus Law Group, PLLC

(57) ABSTRACT

A key depression amount sensor device (100) that is installed below keys of a piano, which keys are aligned along a longitudinal axis, and that detects a depression amount of each of the keys, the key depression amount sensor device including: an electronic circuit board (112) including a plurality of optical sensors that respectively detects the depression amounts of the keys by reflection of light; a housing (110) that extends along the longitudinal axis and houses the electronic circuit board; a clamp mechanism (130) that sandwiches an action beam (300), which is positioned below the keys, in a longitudinal axis direction; and a connection mechanism (120) that connects the clamp mechanism and the housing.

18 Claims, 16 Drawing Sheets

(52) U.S. Cl.
CPC . *G10H 2220/275* (2013.01); *G10H 2220/305* (2013.01); *H05K 1/181* (2013.01); *H05K 2201/10151* (2013.01)

(58) Field of Classification Search
CPC .............. G10H 2220/305; G10H 1/32; G10H 2220/271; G10H 1/0553; H05K 1/181; H05K 2201/10151; G10G 3/04; G10C 1/00; G10C 3/12; G10C 5/10
USPC ........................................................ 356/614
See application file for complete search history.

(56) References Cited

U.S. PATENT DOCUMENTS

| | | | |
|---|---|---|---|
| 5,231,283 A | 7/1993 | Starkey et al. | |
| 5,567,902 A | 10/1996 | Kimble et al. | |
| 12,531,040 B2* | 1/2026 | Nagatsuma ............ | G10G 5/005 |
| 2003/0202834 A1 | 10/2003 | Sato | |
| 2019/0325776 A1 | 10/2019 | Liu et al. | |

FOREIGN PATENT DOCUMENTS

| | | | |
|---|---|---|---|
| CN | 211878796 U | 11/2020 | |
| CN | 214671786 U | 11/2021 | |
| KR | 101644358 B1 | 8/2016 | |
| WO | WO 2019/130755 A1 | 7/2019 | |

* cited by examiner

KEY DEPRESSION AMOUNT SENSOR DEVICE

CROSS REFERENCE TO PRIOR APPLICATION

This application is a National Stage Patent Application of PCT International Patent Application No. PCT/JP2023/011903 (filed on Mar. 24, 2023) under 35 U.S.C. § 371, which claims priority to Japanese Patent Application No. 2022-059430 (filed on Mar. 31, 2022), which are all hereby incorporated by reference in their entirety.

FIELD

The present disclosure relates to a key depression amount sensor device.

BACKGROUND

In recent years, with development of various sensors that can be easily used, attempts of sensing various motions in piano performance of an acoustic piano or the like, feeding back a result thereof, and supporting mastery of musical performance have been performed actively. For example, Patent Literature 1 below proposes a sensor device capable of measuring a depression amount of each of keys of an acoustic piano without contacting the keys.

CITATION LIST

Patent Literature

Patent Literature 1: WO 2019/130755 A

SUMMARY

Technical Problem

However, as is apparent from a fact that periodic tuning is required, an acoustic piano is a delicate instrument. For example, timbre of the acoustic piano may change in a case where a sensor device is attached by application of processing. In addition, in acoustic pianos and digital pianos, a position of a key, a width thereof, and the like vary depending on a piano manufacturer. Thus, a sensor device proposed until now has been a sensor device developed as a dedicated product for each piano.

Thus, the present disclosure proposes a key depression amount sensor device that can be easily attached to and detached from a piano having no sensing function at the time of shipment without application of processing, and that has high versatility.

Solution to Problem

According to the present disclosure, there is provided a key depression amount sensor device that is installed below keys of a piano, which keys are aligned along a longitudinal axis, and that detects a depression amount of each of the keys. The key depression amount sensor device includes: an electronic circuit board including a plurality of optical sensors that respectively detects the depression amounts of the keys by reflection of light; a housing that extends along the longitudinal axis and houses the electronic circuit board; a clamp mechanism that sandwiches an action beam, which is positioned below the keys, in a longitudinal axis direction; and a connection mechanism that connects the clamp mechanism and the housing. In the key depression amount sensor device, the housing includes: a pair of side plates extending in the longitudinal axis direction; and a bottom plate that is coupled to the pair of side plates, extends along the longitudinal axis, and supports the electronic circuit board, the connection mechanism includes: a fixing member that supports the housing; a first rod-shaped member that penetrates a first hole portion provided in a bottom surface of the fixing member and pushes up the bottom plate of the housing to an upper side; and protrusion portions that are provided on the fixing member, and respectively come into contact with upper ends of the side plates of the housing and push down the housing, the clamp mechanism includes: a frame member that includes a pair of side surface portions extending in a vertical direction, and an upper surface portion coupled to the pair of side surface portions and parallel to a horizontal plane; a connection member coupled to one of the side surface portions and sandwiched between the fixing member and the bottom plate; and a second rod-shaped member that penetrates a second hole portion provided in the one side surface portion and engages with a groove provided in an inner surface of the second hole portion, the upper surface portion is placed on the action beam, and the housing is fixed on the action beam by sandwiching of the action beam between other one of the side surface portions and a tip portion of the second rod-shaped member.

Furthermore, according to the present disclosure, there is provided a key depression amount sensor device that is installed above keys of a piano, which keys are aligned along a longitudinal axis, and that detects a depression amount of each of the keys. The key depression amount sensor device includes: an electronic circuit board including a plurality of optical sensors that respectively detects the depression amounts of the keys by reflection of light; a housing that houses the electronic circuit board and blocks light from an outside; a pair of fixing portions that fixes the housing above the keys; and a pair of adjustment mechanisms that adjusts a position of the housing in a vertical direction and a lateral axis direction perpendicular to the longitudinal axis on a horizontally extending plane. In the key depression amount sensor device, each of the fixing portions has a substantially U shape opened upward and supports one of the adjustment mechanisms via a third rod-shaped member sandwiched by the fixing portion, each of the adjustment mechanisms includes: an upper member connected to the housing; and a lower member positioned below the upper member, the upper member includes: a third hole portion penetrating the upper member in the vertical direction; and a second screw member that engages with a groove provided in an inner surface of the third hole portion and has one end portion connected to an upper surface of the lower member, and the lower member includes: a fourth hole portion penetrating the lower member along a lateral axis; and the third rod-shaped member that penetrates the fourth hole portion and is sandwiched inside the fixing portion.

BRIEF DESCRIPTION OF DRAWINGS

FIG. 3 is a side view (part 1) of the main part of the sensor device 100 according to the first embodiment of the present disclosure.

FIG. 17 is a side view of the adjustment mechanism 230 according to the second embodiment of the present disclosure.

DESCRIPTION OF EMBODIMENTS

Figure 1:
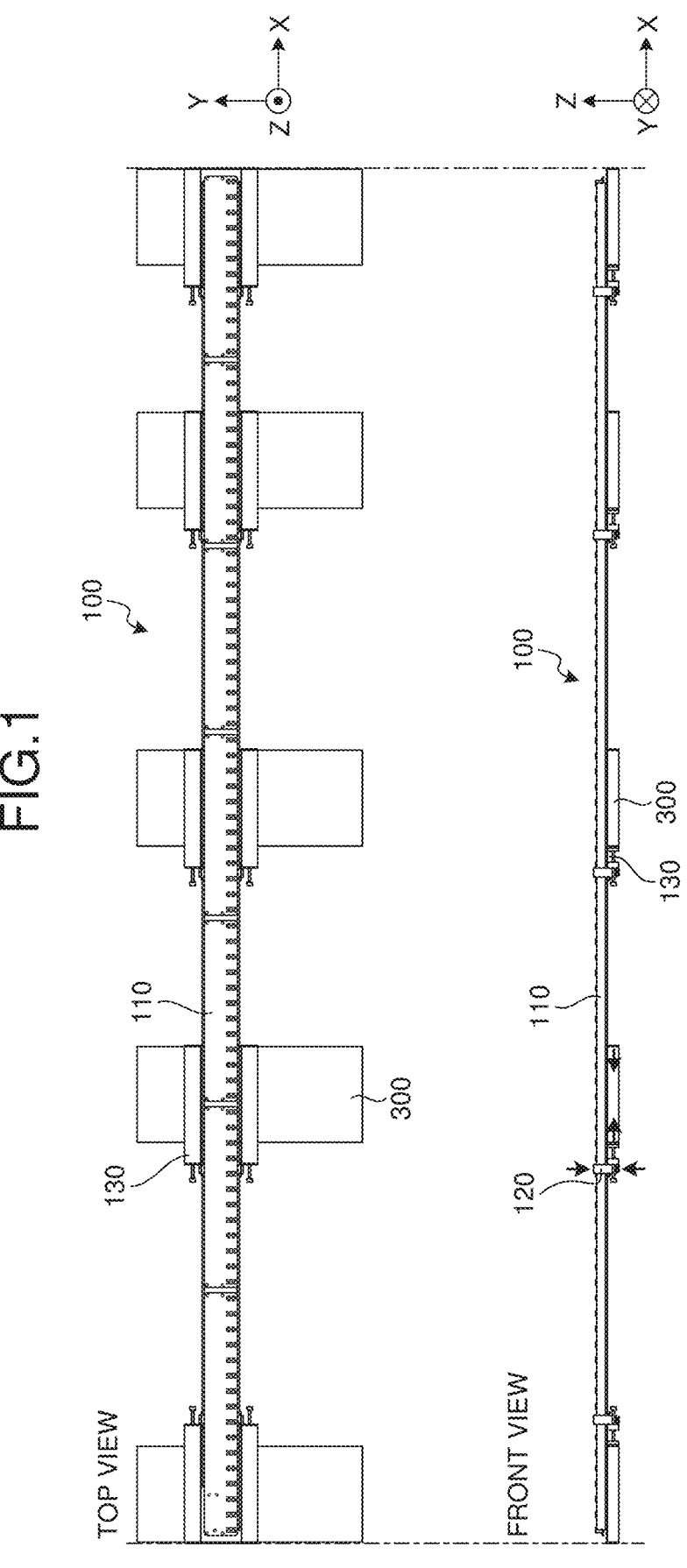
FIG. 1 is a top view and a side view of a sensor device 100 according to a first embodiment of the present disclosure.

In the following, preferred embodiments of the present disclosure will be described in detail with reference to the accompanying drawings. Note that the same reference signs are assigned to components having substantially the same functional configuration, and overlapped description is omitted in the present specification and the drawings.

In addition, the drawings referred to in the following description are drawings for description of an embodiment of the present disclosure and promotion of understanding thereof, and shapes, dimensions, ratios, and the like illustrated in the drawings may be different from actual ones for easy understanding. Similarly, illustration of a part may be omitted. Furthermore, a sensor device illustrated in the drawings can be appropriately modified in design in consideration of the following description and a known technique.

Note that a grand piano and an upright piano are referred to as an acoustic piano in the present specification. Note that the following embodiments of the present disclosure will be mainly described with a case where application to an acoustic piano is performed being an example. However, the present embodiment is not necessarily applied to an acoustic piano, and can be applied to a digital piano.

Note that the description will be made in the following order.

1. Background to creation of embodiments of the present disclosure
2. First embodiment
2.1 Detailed configuration
2.2 Adjustment of an electronic circuit board
2.3 Height adjustment
3. Second embodiment
3.1 Detailed configuration
3.2 Light blocking function
4. Conclusion
5. Supplementary note

1. BACKGROUND TO CREATION OF EMBODIMENTS OF THE PRESENT DISCLOSURE

First, before description of the embodiments of the present disclosure, a background leading to the creation of the embodiments of the present disclosure by the present inventors will be described.

As described above, in recent years, with development of various sensors that can be easily used, attempts of sensing various motions, for example, in performance of an acoustic piano (specifically, a grand piano or an upright piano), feeding back a result thereof, and supporting mastery of musical performance have been performed actively. For example, Patent Literature 1 proposes a sensor device in which a photoreflector sensor is used and which is capable of measuring a depression amount of each of keys of an acoustic piano without contacting the keys.

However, as is apparent from a fact that periodic tuning is required, the acoustic piano is a very delicate instrument, and timbre of the piano may change in a case where the sensor device is attached by making of a hole or application of excessive force. In addition, in acoustic pianos and digital pianos, a position of a key, a width thereof, and the like vary depending on a piano manufacturer or a model. Thus, a sensor device proposed until now is a sensor device developed as a dedicated product for a piano or a model of each manufacturer. In other words, a highly versatile sensor device capable of measuring a depression amount of each key according to a position, width, and the like of the key which position, width, and the like vary depending on a piano manufacturer or a model has not been proposed until now.

Thus, in view of such a situation, the present inventors have created embodiments of a highly versatile sensor device that can be easily attached to and detached from a piano having no sensing function at the time of shipment without application of processing or the like. More specifically, the inventors have created an embodiment of a non-contact key depression amount sensor device arranged below keys of a piano, and an embodiment of a non-contact key depression amount sensor device arranged above keys of a piano. Hereinafter, details of these embodiments will be sequentially described.

2. FIRST EMBODIMENT

<2.1 Detailed Configuration>

Figure 2:
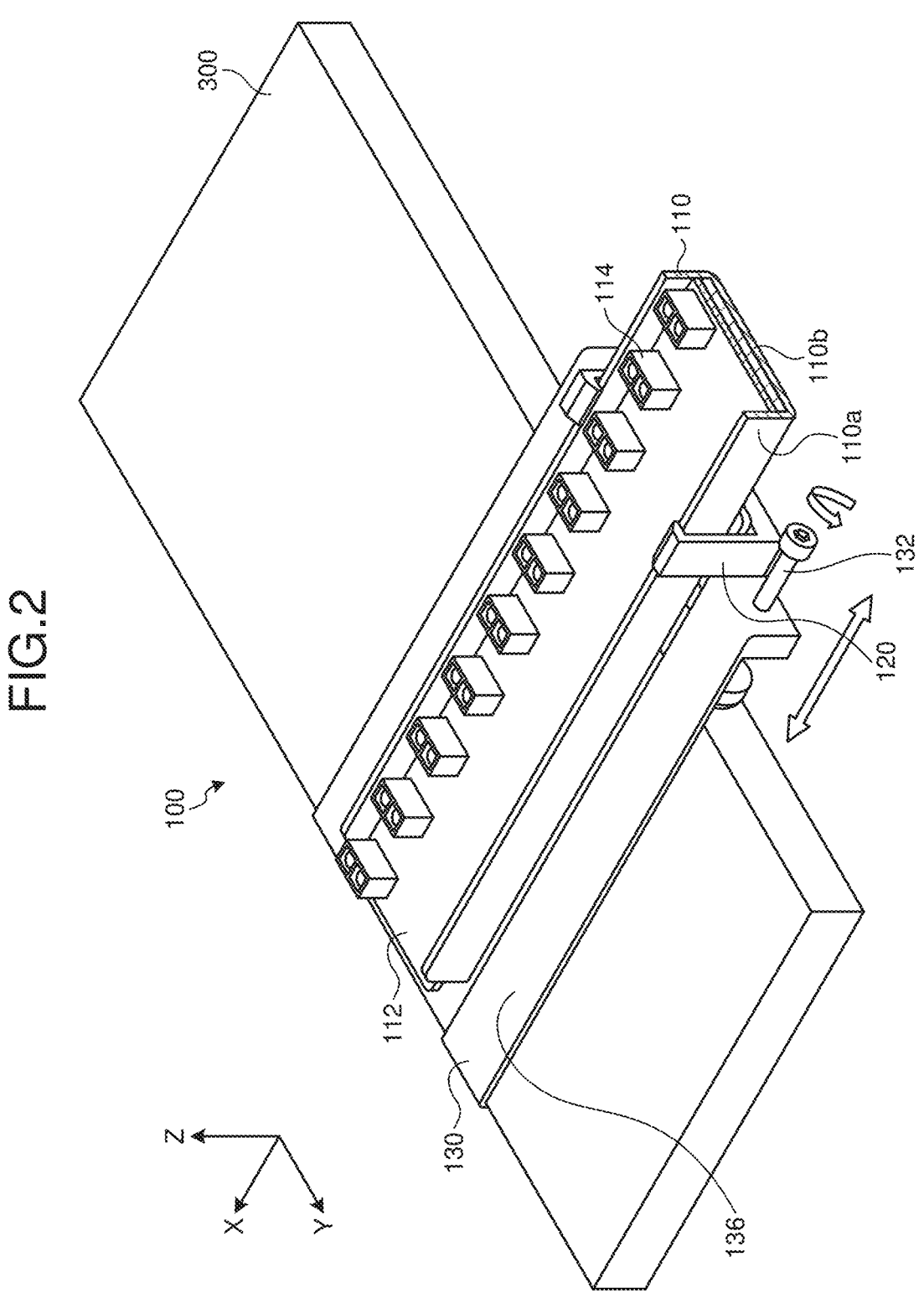
FIG. 2 is a perspective view of a main part of the sensor device 100 according to the first embodiment of the present disclosure.
Figure 3:
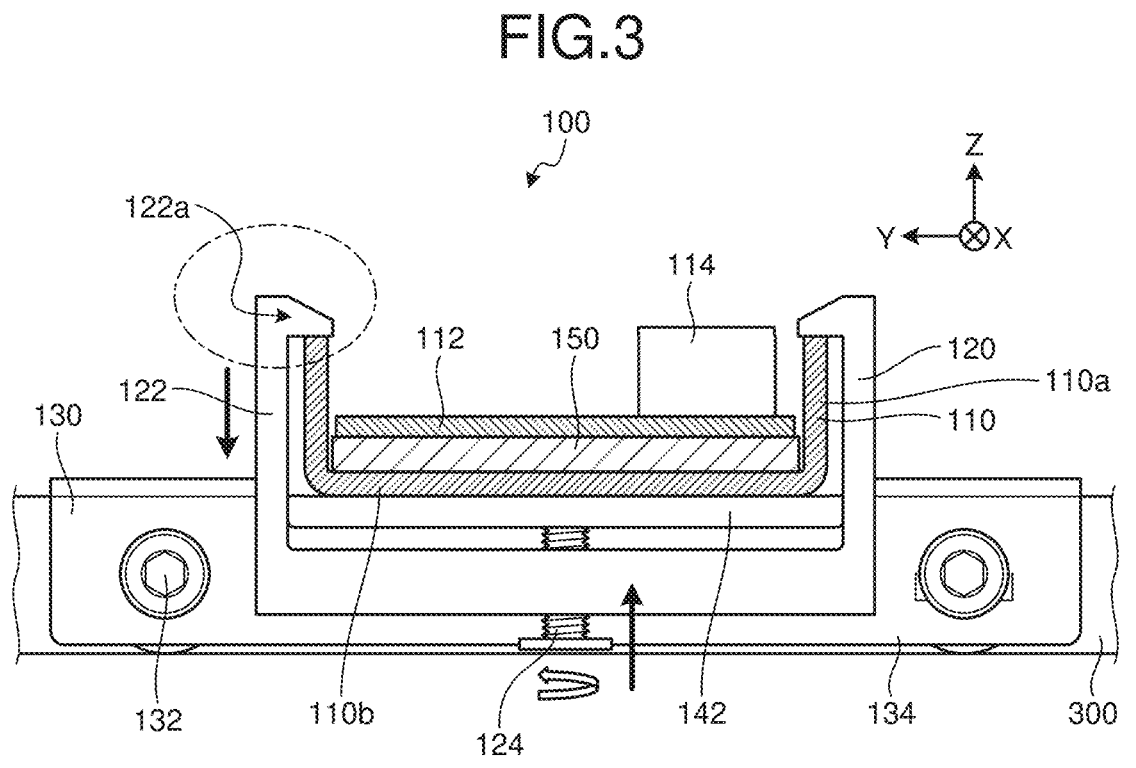
Figure 4:
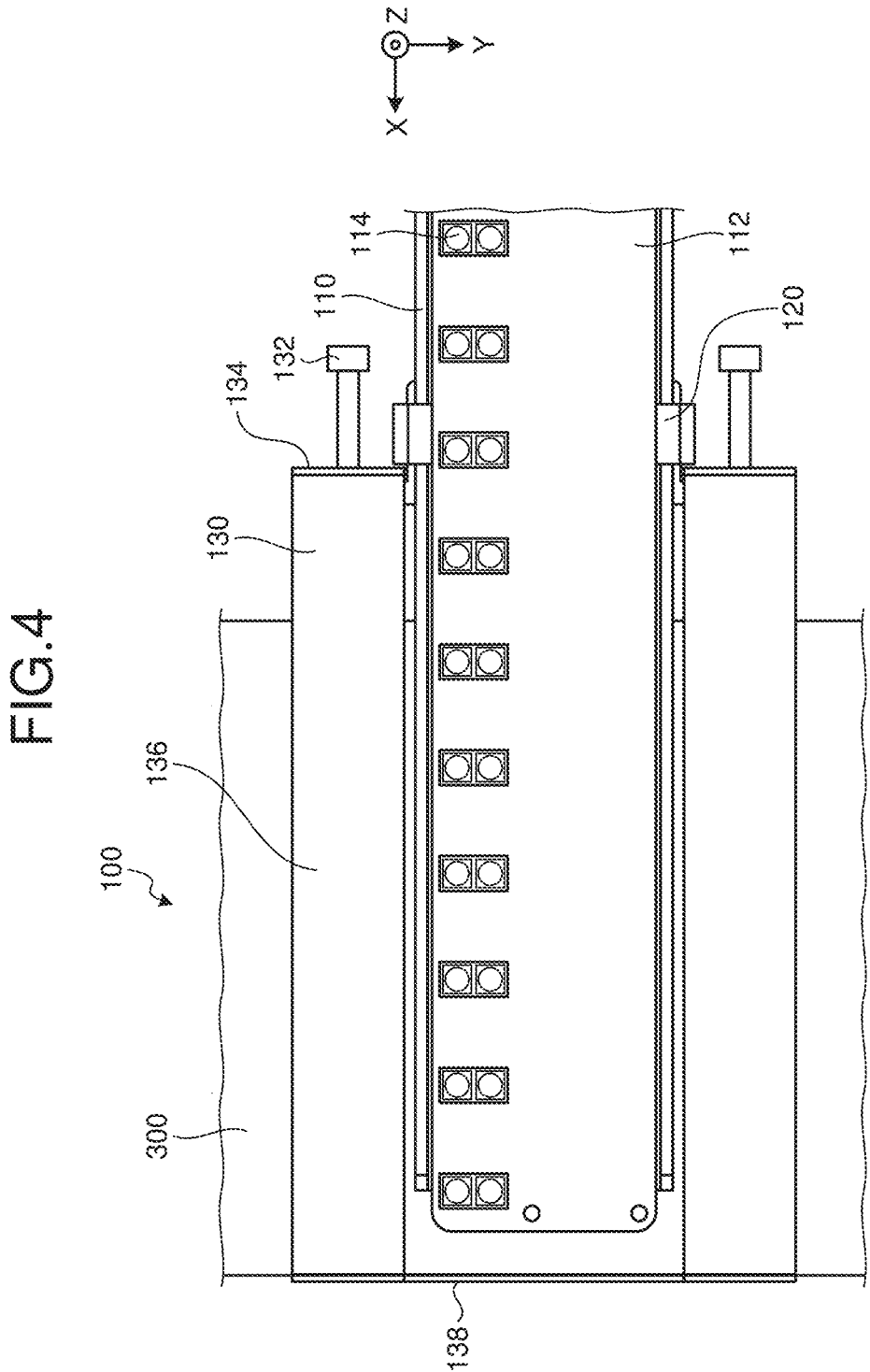
FIG. 4 is a top view of the main part of the sensor device 100 according to the first embodiment of the present disclosure.
Figure 5:
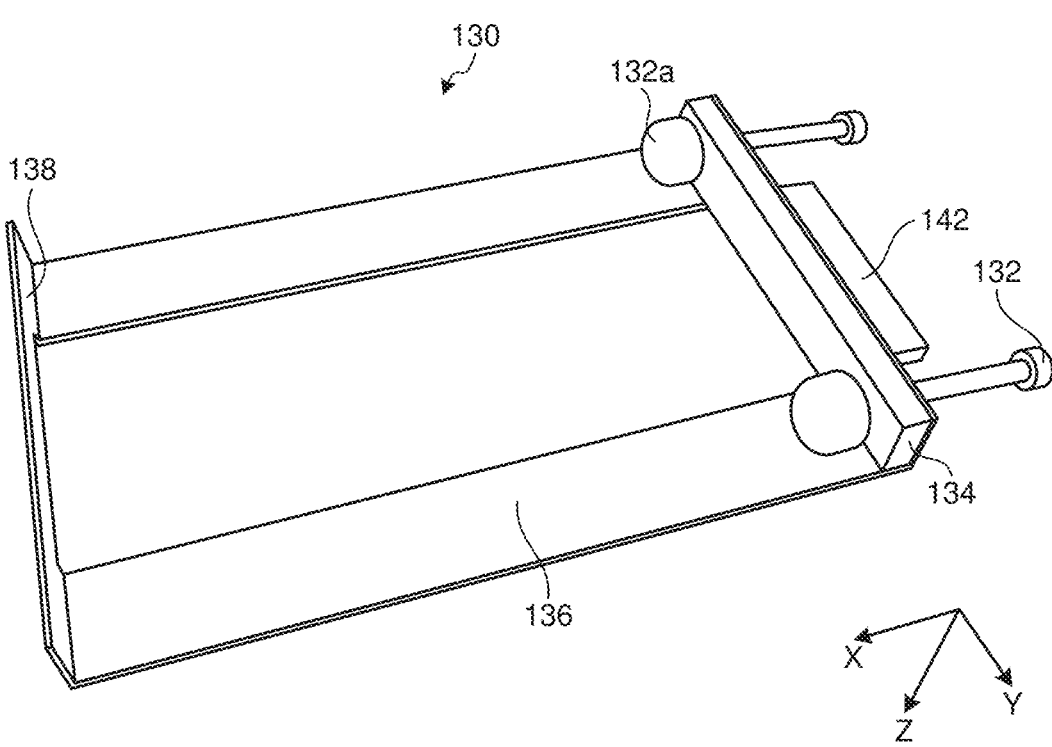
FIG. 5 is a perspective view (part 1) of a clamp mechanism 130 according to the first embodiment of the present disclosure.
Figure 6:
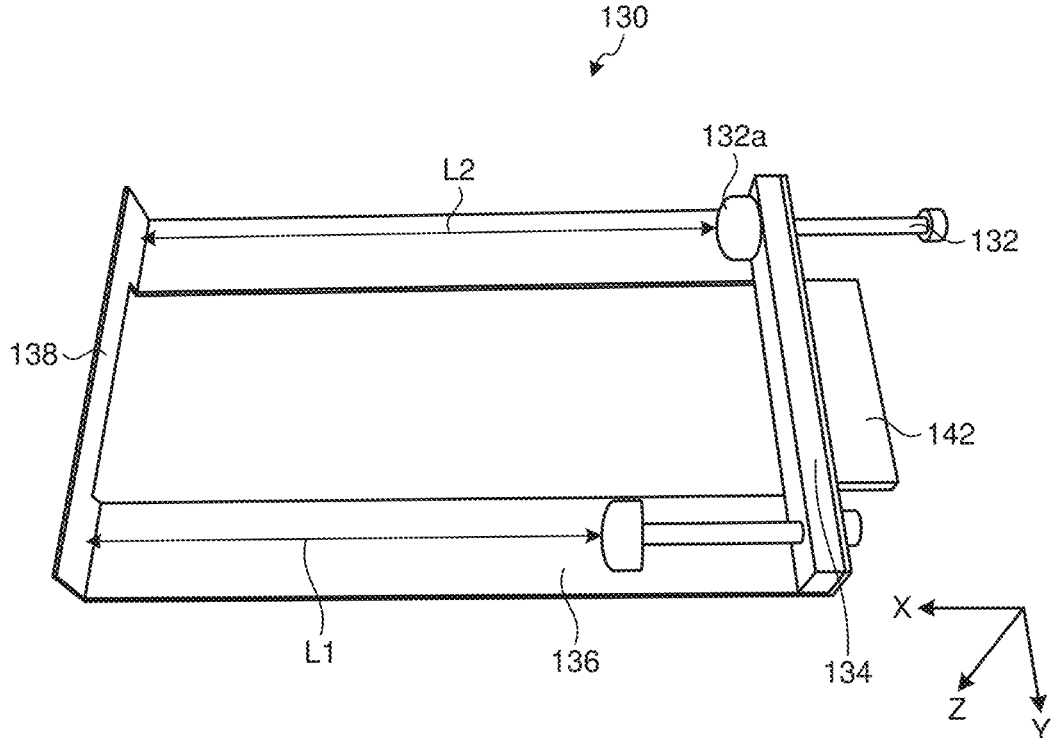
FIG. 6 is a perspective view (part 2) of the clamp mechanism 130 according to the first embodiment of the present disclosure.
Figure 7:
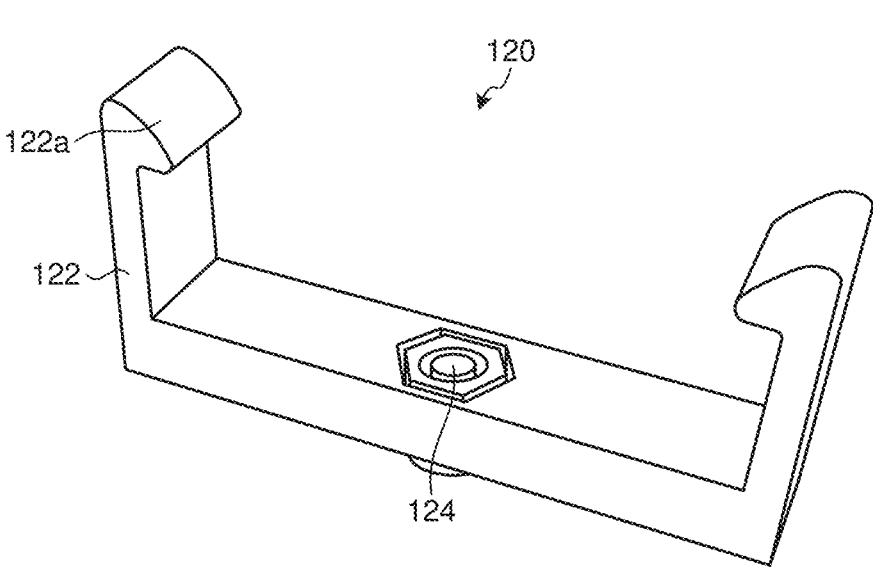
FIG. 7 is a perspective view of a frame lock 120 according to the first embodiment of the present disclosure.
Figure 8:
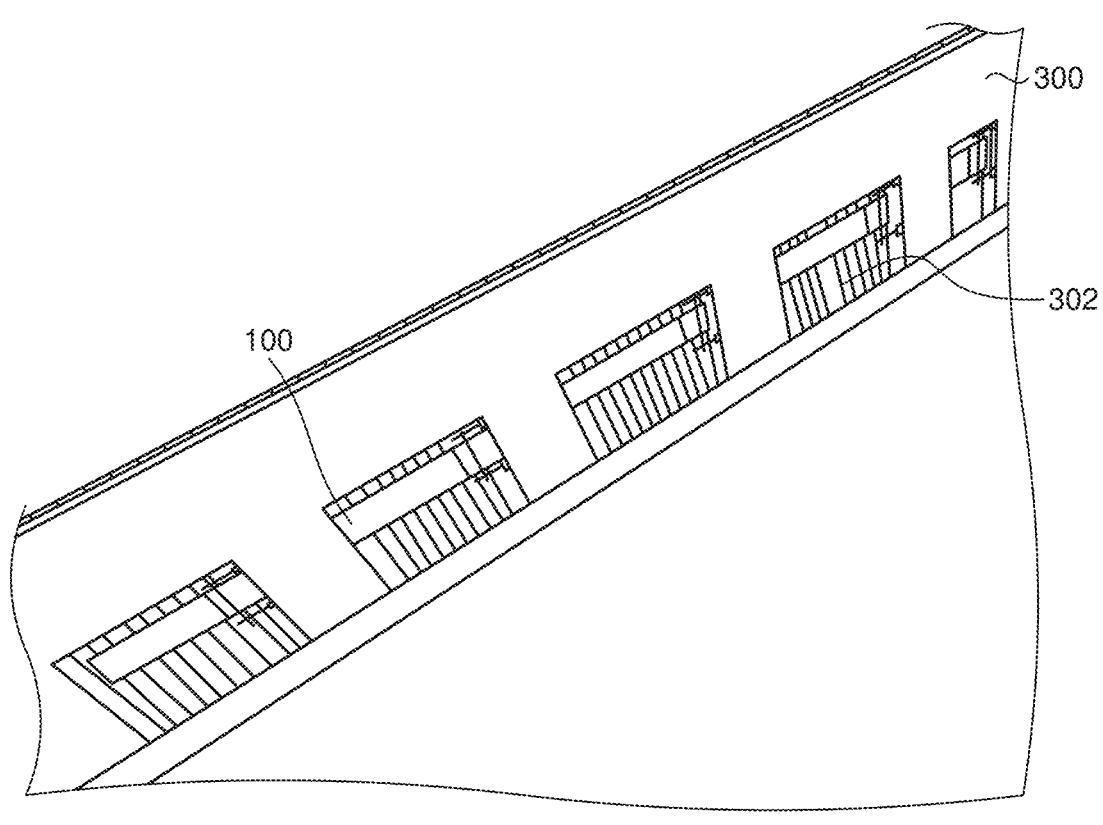
FIG. 8 is an explanatory diagram (part 1) for describing an installation position of the sensor device 100 according to the first embodiment of the present disclosure.
Figure 9:
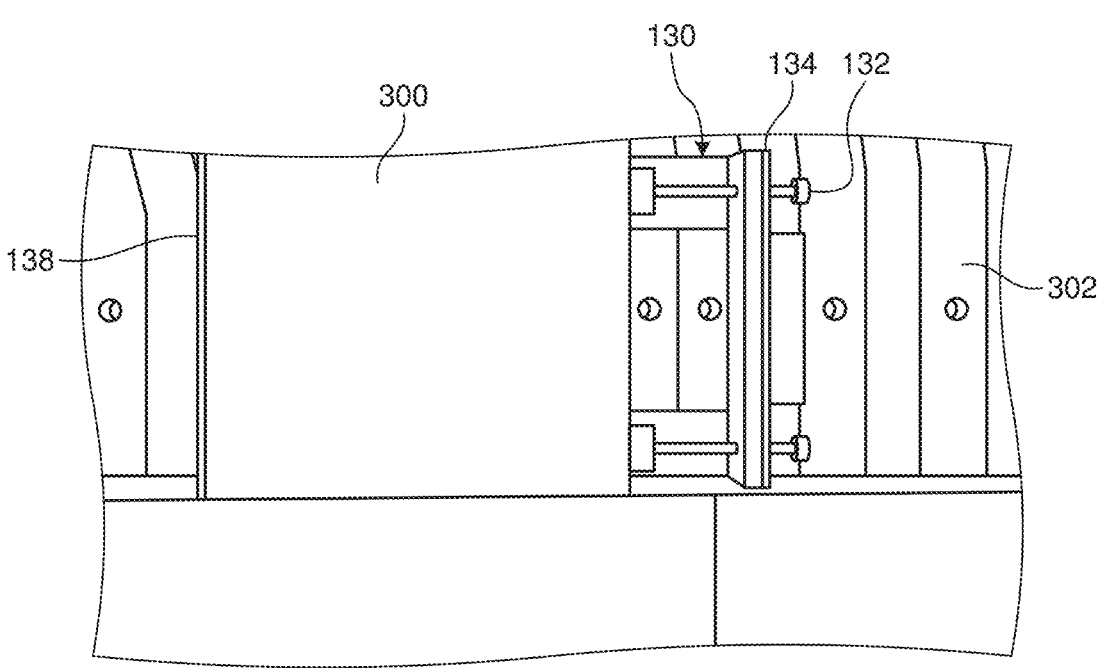
FIG. 9 is an explanatory diagram (part 2) for describing the installation position of the sensor device 100 according to the first embodiment of the present disclosure.

First, as a first embodiment of the present disclosure, a sensor device (key depression amount sensor device) that is installed below keys of an acoustic piano and detects a depression amount of each of the keys will be described. A detailed configuration of a sensor device 100 of the present embodiment will be described with reference to FIG. 1 to FIG. 9. FIG. 1 is a top view (upper part of FIG. 1) and a side view (lower part of FIG. 1) of the sensor device 100 according to the present embodiment. FIG. 2 is a perspective view of a main part of the sensor device 100 according to the present embodiment, FIG. 3 is a side view of the main part of the sensor device 100 according to the present embodiment, and FIG. 4 is a top view of the main part of the sensor device 100 according to the present embodiment. FIG. 5 and FIG. 6 are perspective views of a clamp mechanism 130 according to the present open embodiment, and specifically are views of the clamp mechanism 130 viewed from a lower side. FIG. 7 is a perspective view of a frame lock 120 according to the present embodiment. Furthermore, FIG. 8 and FIG. 9 are explanatory diagrams for describing an installation position of the sensor device 100 according to the present embodiment.

The sensor device 100 according to the present embodiment is installed inside a mechanism called an "action" of an acoustic piano. The action is a mechanism for transmitting a movement of a key due to a keystroke by a player to a hammer that strikes a string. In the action, the predetermined number (such as five) of structural members (referred to as "action beams" or "beams" in the present specification) are provided below keys, and the sensor device 100 according to the present embodiment is fixed to the beams by clamp mechanisms (described later). Note that the number, a position, and a size (width and thickness) of the beams of the acoustic piano vary depending on a piano manufacturer and a piano model.

Specifically, as illustrated in the upper part of FIG. 1, the sensor device 100 according to the present embodiment includes a main frame (housing) 110 that extends in an X-axis (longitudinal axis) direction and houses a plurality of electronic circuit boards having a plurality of photoreflector sensors that respectively detects depression amounts of keys by reflection of light. In addition, as illustrated in the upper part and lower part of FIG. 1, the sensor device 100 includes a plurality of clamp mechanisms 130 that respectively sandwiches, in the X-axis direction, a plurality of beams 300 located below the keys, and a plurality of frame locks (connection mechanisms) 120 that respectively connects the clamp mechanisms 130 and the main frame 110. An example of a sensor device 100 corresponding to an acoustic piano having five beams 300 is illustrated in FIG. 1. Specifically, to correspond to the acoustic piano having the five beams 300, the sensor device 100 has five clamp mechanisms 130 and five frame locks 120. Note that the number of the clamp mechanisms 130 and the frame locks 120 is not specifically limited in the present embodiment. Furthermore, in the present specification and the drawings accompanying the present specification, the X axis means an axis in a direction in which the keys are aligned. In addition, a Y axis means an axis that perpendicularly intersects with the X axis on a plane including the plurality of aligned keys, in other words, means an axis parallel to a long side of the rectangular keys. Furthermore, a Z axis means an axis in a vertical direction of the acoustic piano. Hereinafter, details of each element of the sensor device 100 according to the present embodiment will be sequentially described.

(Main Frame 110)

As illustrated in FIG. 2, FIG. 3, and FIG. 4, the main frame 110 houses a plurality of electronic circuit boards 112. Specifically, as illustrated in FIG. 2 and FIG. 3, the main frame 110 includes a pair of side plates 110a that is parallel to a plane including the X axis and the Z axis and that extends in the X-axis direction, and a bottom plate 110b that is coupled to the pair of side plates 110a, is parallel to a plane including the X axis and the Y axis, and extends in the X-axis direction. Specifically, as illustrated in FIG. 3, the main frame 110 can be said to be a plate that has a substantially U-shaped (more specifically, "ko" in Japanese katakana) cross section opened upward or a substantially U-shaped cross section bent at a right angle, and that has both ends bent at a right angle. For example, the main frame 110 can be formed of, for example, a metal plate.

As illustrated in FIG. 2, FIG. 3, and FIG. 4, the plurality of electronic circuit boards 112 is installed on the bottom plate 110b of the main frame 110. Note that in the present embodiment, an adjustment plate 150 may be installed between the bottom plate 110b of the main frame 110 and the electronic circuit boards 112, and details of the adjustment plate 150 will be described later.

A plurality of photoreflector sensors 114, an electronic circuit for measurement, and an electronic component (not illustrated) are mounted on each of the electronic circuit boards 112. For example, the electronic component may be an analog-digital (AD) converter that converts sensing data of the photoreflector sensors 114 into a digital signal. For example, the sensing data converted by the AD converter is output to a computer installed outside the acoustic piano.

Specifically, as illustrated in FIG. 2 and FIG. 4, on each of the electronic circuit boards 112, the plurality of photoreflector sensors 114 is arranged at predetermined intervals in the X-axis direction in accordance with a position of each of the keys. More specifically, the sensor device 100 according to the present embodiment is installed in such a manner that one photoreflector sensor 114 is positioned under each key (white key or black key). Note that a mechanism capable of adjusting a position of each of the electronic circuit boards 112 in the X-axis direction is included in the present embodiment. Details of the adjustment mechanism will be described later.

Each of the photoreflector sensors 114 includes a pair of light emitting element (not illustrated) that emits infrared light and light receiving element (not illustrated) that receives the infrared light. More specifically, the light emitting element of the photoreflector sensor 114 includes, for example, a light emitting diode (LED) or the like, and can emit light having a predetermined wavelength (such as infrared light). On the other hand, the light receiving element of the photoreflector sensor 114 includes, for example, a photodiode, and can generate a photocurrent (signal) according to an amount of received light. A part of the light emitted by the light emitting element is reflected on a lower surface of the key and detected by the light receiving element as reflected light. Specifically, for example, in a case where the key is struck by a player and moved downward, a length of a path in which the light emitted by the light emitting element travels until being detected by the light receiving element changes, whereby the amount of light detected by the light receiving element changes. Thus, according to the photoreflector sensor 114, since the amount of the light detected by the light receiving element changes according to a movement amount of the key in the vertical direction, the movement amount of the key can be detected from the signal from the photoreflector sensor 114.

For example, since the photoreflector sensor 114 has time resolution of about 1 millisecond and spatial resolution of about 0.01 mm, it is possible to detect a temporal change in the movement amount of the key with high accuracy. More specifically, for example, a moment when a signal value of the photoreflector sensor 114 exceeds a predetermined threshold can be regarded as time when the key starts moving (keystroke start time) (time when the key starts descending). The threshold can be appropriately set in consideration of noise (such as white noise) and variation of the photoreflector sensor 114 itself, and is set to, for example, twice the standard deviation of the signal value from the photo reflector sensor 114 of when the key is stationary on an upper side. In addition, since the temporal change of the movement amount of the key can be detected with high accuracy by the photoreflector sensor 114, the photoreflector sensor 114 can detect not only the above-described keystroke start time but also keystroke end time when the keystroke ends (time when the key starts ascending), keystroke time from the keystroke start time to the keystroke end time, and the like for each key. Furthermore, according to the photoreflector sensor 114, it is possible to detect a temporal change in a speed of key striking (movement speed of the key), acceleration (movement acceleration of the key), a movement amount, and the like for each key. Note that the present embodiment is not limited to use the photoreflector sensor 114, and an optical sensor such as a time of flight (ToF) sensor capable of measuring a distance to a key may be used.

(Clamp Mechanism 130)

As described above, when the sensor device 100 is fixed to the acoustic piano, it is strongly required to avoid causing a change in timbre of the acoustic piano by making a hole in the acoustic piano or applying a load to distort a component of the acoustic piano by applying excessive force. Thus, in the present embodiment, the plurality of beams 300 positioned below the keys is sandwiched in the X-axis direction respectively by the clamp mechanisms 130, whereby the sensor device 100 according to the present embodiment is fixed in the action mechanism of the acoustic piano. In the present embodiment, in such a manner, since the sensor device 100 is fixed in the action mechanism of the acoustic piano while application of processing such as making a hole, application of excessive force, or the like to an element included in the action mechanism is avoided, it is possible to avoid a change in the timbre of the acoustic piano.

Specifically, as illustrated in FIG. 5 and FIG. 6 in which the clamp mechanisms 130 are viewed from a lower side, each of the clamp mechanisms 130 includes a frame member including a pair of side surface portions 134 and 138 parallel to a plane including the Y axis and the Z axis and extending in the Y-axis direction, and an upper surface portion 136 coupled to the pair of side surface portions 134 and 138, parallel to the plane including the X axis and the Y axis, and extending along the X axis. Specifically, as illustrated in FIG. 5 and FIG. 6, the upper surface portion 136 includes two flat plates extending in the X-axis direction. The frame member can be formed of, for example, a metal plate.

In addition, the clamp mechanism 130 includes a connection member 142 which is coupled to the one side surface portion 134 and on which the main frame 110 is placed, and a plurality of screws (second rod-shaped members) 132 that respectively penetrates a plurality of holes (second hole portions) provided in the side surface portion 134 and engages with grooves provided in inner surfaces of the holes. Specifically, for example, as illustrated in FIG. 5 and FIG. 6, the clamp mechanism 130 includes two holes provided in the side surface portion 134 and two screws 132. Furthermore, a tip portion of each of the screws 132 has, for example, a flat plate member 132a that comes into contact with a side surface of one of the beams 300. For example, the flat plate member 132a can be formed of a resin material.

Specifically, as illustrated in FIG. 2, FIG. 3, and FIG. 4, the upper surface portion 136 of the clamp mechanism 130 is placed on the beam 300. Furthermore, as illustrated in FIG. 2, the screws 132 are turned and the beam 300 is sandwiched in the X-axis direction between the other side surface portion 138 and the flat plate members 132a at the tip portions of the screws 132, whereby the clamp mechanism 130, that is, the sensor device 100 can be fixed on the beam 300. In the present embodiment, since the sensor device 100 is fixed to the action mechanism by the beam 300 being sandwiched between the side surface portion 138 and the screws 132, processing such as making a hole in the element included in the action mechanism is not performed. In addition, in the present embodiment, since it is possible to turn the screws 132 according to a width of the beam 300 and to sandwich the beam 300 between the side surface portion 138 and the screws 132, sandwiching force is balanced in the clamp mechanism 130 and the beam 300, and it is possible to avoid application of excessive force to the beam 300 of the action mechanism and distortion of the beam 300.

Here, a means to perform fixing by turning the screws 132 and sandwiching the beam 300 has been described. However, in the present embodiment, the screws 132 are not necessarily used, and the beam 300 may be sandwiched and fixed by utilization of a biasing member such as a spring or a lever instead of the screws 132. However, in a case where the biasing member is used, there is a possibility that force is unnecessarily applied to the beam 300. Thus, it is preferable to use the screws 132 in the present embodiment. In addition, in the present embodiment, it is preferable to use a torque driver to sandwich the beam 300 with constant force when turning the screws 132.

As described above, the number, position, and size of the beams 300 vary depending on a piano manufacturer and a piano model. Thus, in the present embodiment, the clamp mechanisms 130 the number and size of which correspond to the piano are prepared. Specifically, in the present embodiment, the plurality of clamp mechanisms 130 the number of which corresponds to the number of the beams 300 of the acoustic piano is prepared. Furthermore, in the present embodiment, for example, each of the clamp mechanisms 130 described above can freely change a distance between the side surface portion 138 and the flat plate member 132a at the tip portion of each of the screws 132 from L1 to L2 as illustrated in FIG. 6. Thus, in the present embodiment, the clamp mechanism 130 can correspond to the beams 300 having different widths. Furthermore, in the present embodiment, when the clamp mechanisms 130 of various sizes (for example, corresponding to 35 to 55 mm, corresponding to 55 to 75 mm, and corresponding to 75 to 95 mm) are prepared, it is possible to correspond to the beams 300 having a width of 35 to 95 mm.

(Frame Lock 120)

As illustrated in FIG. 7, the frame lock 120 includes a fixing member 122 that has a substantially U shape opened upward or a substantially U shape bent at a right angle, and that supports the main frame 110. The fixing member 122 can be formed of, for example, a resin material. In addition, the fixing member 122 has protrusion portions 122a that are provided at upper end portions of the fixing member 122, and respectively come into contact with upper ends of the side plates 110a of the main frame 110 and push down the main frame 110.

Furthermore, as illustrated in FIG. 3 and FIG. 7, the frame lock 120 further includes a screw (first rod-shaped member) 124 that penetrates a hole (first hole portion) provided in bottom surfaces of the connection member 142 of the clamp mechanism 130 and the fixing member 122 and pushes up the bottom plate 110*b* of the main frame 110 to an upper side. The screw 124 may engage with a groove provided in an inner surface of the hole provided in the connection member 142 and the fixing member 122. In the present embodiment, a tip portion of the screw 124 may be provided with a biasing member such as a spring, or may be provided with an elastic body such as a sponge-like member.

In the present embodiment, as illustrated in FIG. 3, the main frame 110 is placed inside the fixing member 122 of the frame lock 120. Then, the screw 124 is turned from a lower side of the frame lock 120, whereby the fixing member 122 of the frame lock 120 and the connection member 142 of the clamp mechanism 130 are fixed, and the bottom plate 110*b* of the main frame 110 is pushed up. Then, upper ends of the side plates 110*a* of the pushed main frame 110 come into contact with the protrusion portions 122*a* of the fixing member 122 and are pushed down, whereby the main frame 110 is fixed. In addition, in the present embodiment, it is preferable to use a torque driver to turn the screw 124.

In the present embodiment, by sandwiching the connection member 142 of the clamp mechanism 130 and the main frame 110 in the Z-axis direction by the fixing member 122 of the frame lock 120, the main frame 110 can be fixed to the clamp mechanism 130 fixed to the beam 300. Thus, according to the present embodiment, it is possible to fix the sensor device 100 without applying processing such as making a hole in the element included in the action mechanism. Furthermore, in the present embodiment, after the clamp mechanisms 130 are respectively attached to the beams 300, force for fixing relative positions of the clamp mechanism 130 and the main frame 110 is applied by the frame lock 120 in the Z-axis direction. Thus, force that can deform the beam 300 or the like is not applied. In addition, in the present embodiment, since the relative positions of the main frame 110 and the clamp mechanism 130 are not limited and can be freely adjusted in fixation thereof, the clamp mechanism 130 and the main frame 110 can be fixed without being affected by the beam 300.

Furthermore, as illustrated in FIG. 8 and FIG. 9, the sensor device 100 according to the present embodiment described above can be fixed below keys 302 and above the beam 300 in the action mechanism. Specifically, after the action mechanism is pulled out from the acoustic piano, the clamp mechanism 130 is attached to the beam 300 in the action mechanism and the main frame 110 is fixed by the frame lock 120, whereby the sensor device 100 is fixedly installed. Note that the sensor device 100 is installed in such a manner that the position of each of the keys 302 and the position of each of the photoreflector sensors 114 are aligned. Adjustment of the position of the sensor device 100 (specifically, electronic circuit boards 112) in the X-axis direction will be described later.

<2.2 Adjustment of an Electronic Circuit Board>

Figure 10:
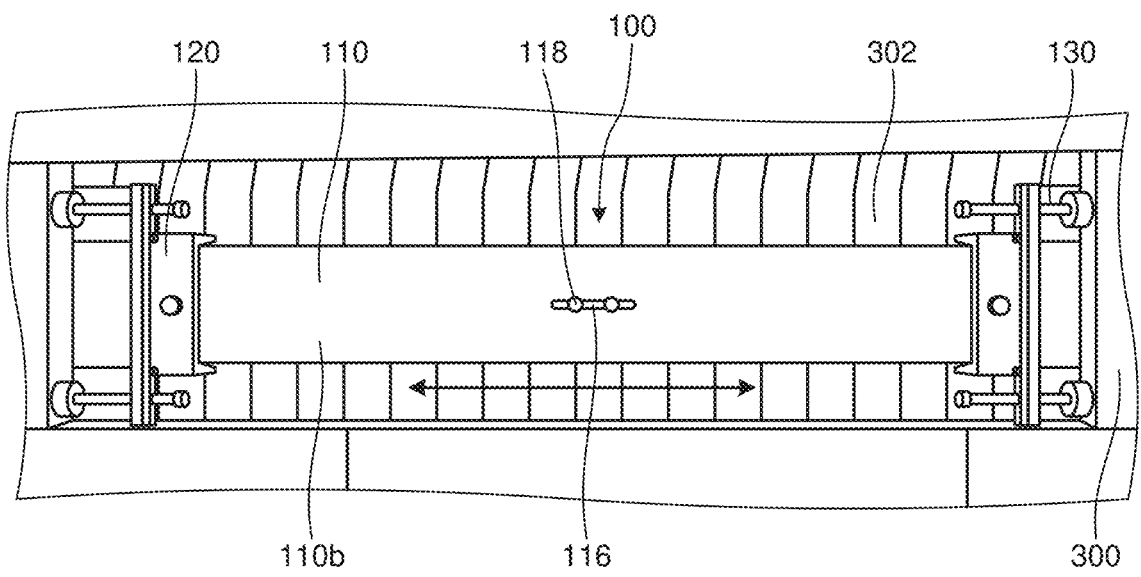
FIG. 10 is a bottom view of a main frame 110 according to the first embodiment of the present disclosure.
Figure 11:
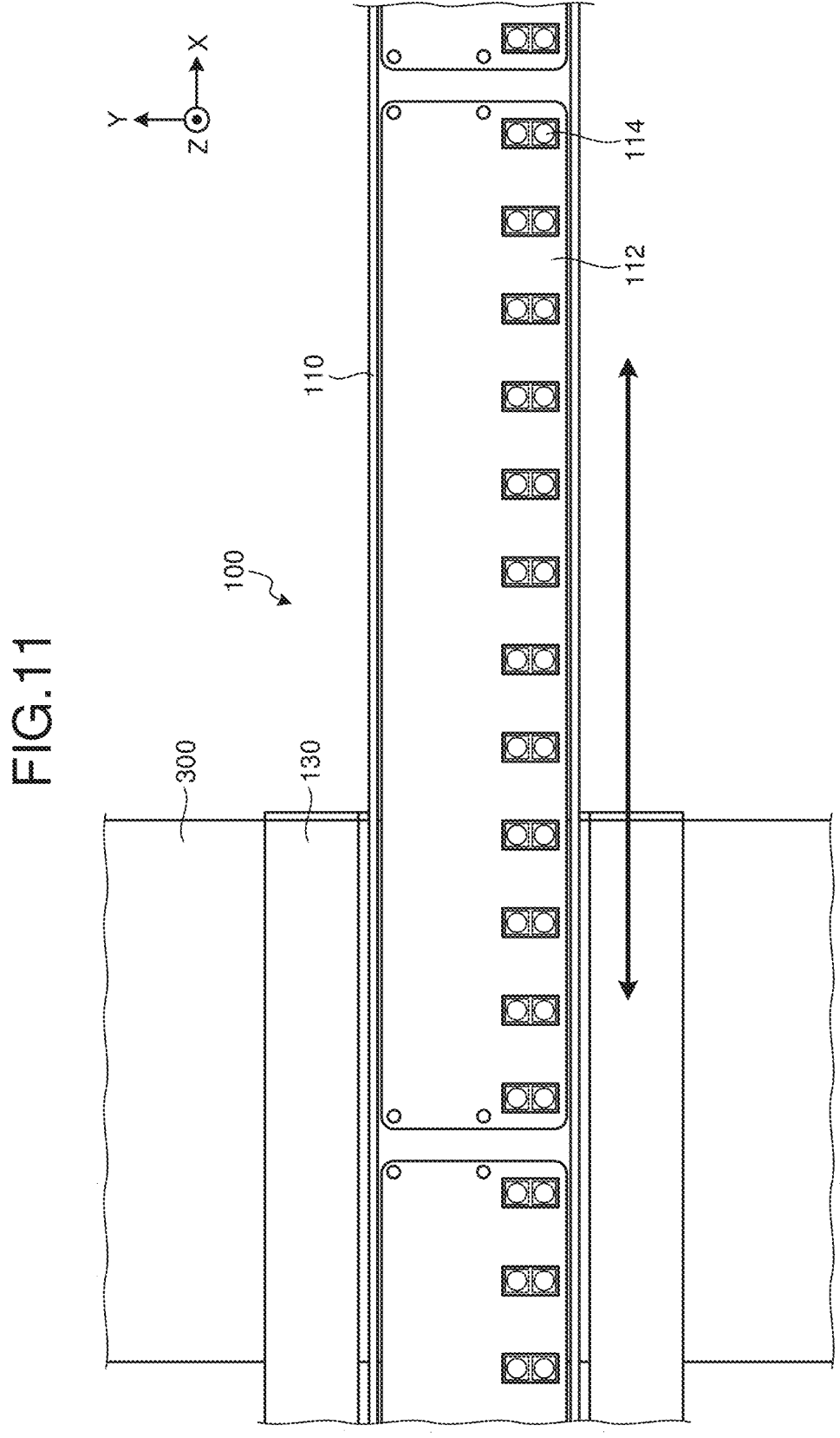
FIG. 11 is a top view of a main part of the main frame 110 according to the first embodiment of the present disclosure.

Next, an adjustment mechanism for the position of each of the electronic circuit boards 112 will be described with reference to FIG. 10 and FIG. 11. FIG. 10 is a bottom view of the main frame 110 according to the present embodiment, and FIG. 11 is a top view of a main part of the main frame 110 according to the present embodiment.

As described above, the position, width, and the like of the keys 302 vary depending on a piano manufacturer or a model. Thus, in the present embodiment, a mechanism of adjusting a position of the electronic circuit board 112 in the X-axis direction is provided, whereby the positions of each of the keys 302 and each of the photoreflector sensors 114 are adjusted to be aligned. In such a manner, according to the present embodiment, it is possible to correspond to the keys 302 having different positions and widths.

In the present embodiment, the main frame 110 of the sensor device 100 includes the plurality of electronic circuit boards 112 arranged in the X-axis direction.

Specifically, the number of the keys 302 for one octave is 12 keys (specifically, seven white keys and five black keys). Thus, in the present embodiment, as illustrated in FIG. 11, the electronic circuit boards 112 in each of which the 12 photoreflector sensors 114 are arranged in the X-axis direction at predetermined intervals in such a manner as to respectively correspond to the 12 keys 302 are prepared. Furthermore, in the present embodiment, the electronic circuit board 112 in which the 16 photoreflector sensors 114 are arranged in the X-axis direction at predetermined intervals in such a manner as to respectively correspond to the 16 keys 302 is also prepared. In the present embodiment, the six electronic circuit boards 112 each of which includes the 12 photoreflector sensors 114 as described above and the one electronic circuit board 112 that includes the 16 photo reflector sensors 114 as described above are prepared, whereby it is possible to cover all the 88 keys 302 of the acoustic piano.

Although the 12 photoreflector sensors 114 corresponding to the keys 302 for one octave are provided above each of the electronic circuit boards 112 for convenience in the present embodiment, the present embodiment is not limited to such an embodiment. For example, a plurality of photoreflector sensors 114 the number of which is other than 12 and 16 may be provided above an electronic circuit board 112, and the number of electronic circuit boards 112 included in the main frame 110 may be other than 7, and is not specifically limited.

That is, in the present embodiment, the plurality of electronic circuit boards 112 each of which has the predetermined number of photoreflector sensors 114 is prepared instead of one electronic circuit board 112 having a plurality of photoreflector sensors 114 that covers all the 88 keys 302. In such a manner, in the present embodiment, it is possible to correspond to the keys 302 having different positions and widths.

Specifically, in the present embodiment, as illustrated in FIG. 10, the bottom plate 110*b* of the main frame 110 is provided with a long hole (long hole portion) 116 that penetrates the bottom plate 110*b* and is elongated in the X-axis direction. A hole penetrating the electronic circuit board 112 is also provided on a side of the electronic circuit board 112. In the present embodiment, by being screwed by a screw 118 (first screw member) penetrating the long hole 116 and the above hole, each of the electronic circuit boards 112 is fixed to the main frame 110. In the present embodiment, one of the holes penetrated by the screw 118 is made to be the long hole extending in the X-axis direction, whereby it is possible to adjust the position of the electronic circuit board 112 in the X-axis direction. Note that in the present embodiment, the side of the main frame 110 is not limited to be the long hole, and the side of the electronic circuit board 112 may be a long hole.

<2.3 Height Adjustment>

Figure 12:
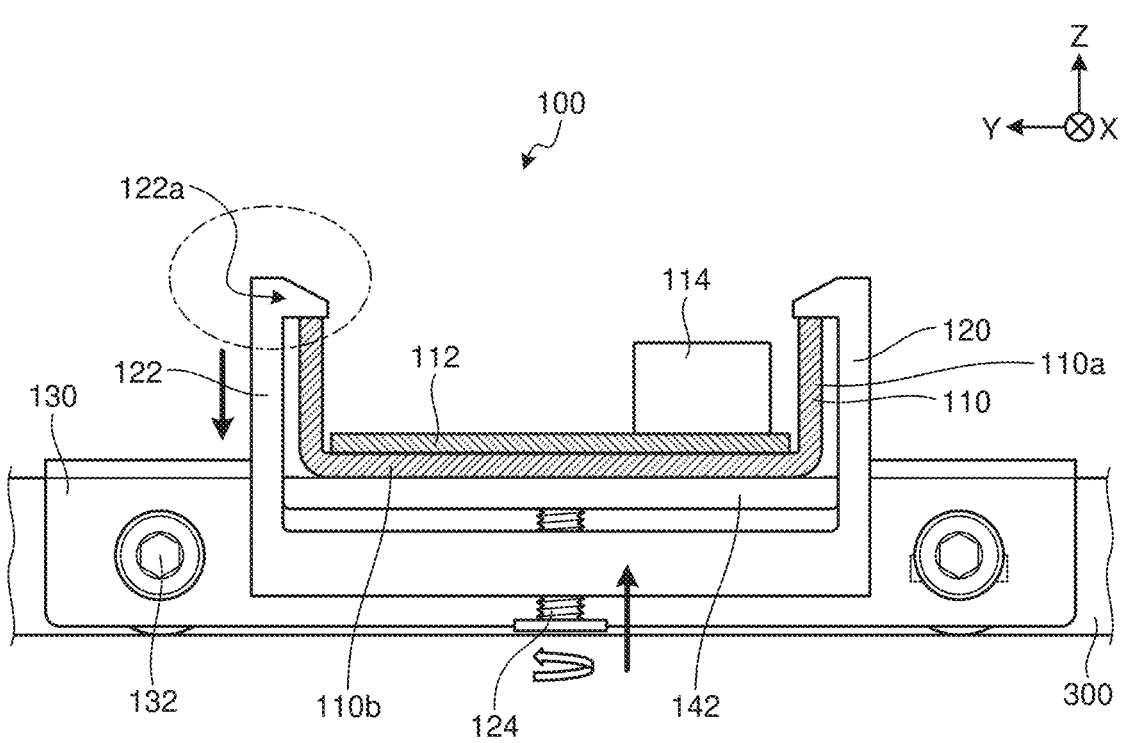
FIG. 12 is a side view (part 2) of the main part of the sensor device 100 according to the first embodiment of the present disclosure.

Next, an adjustment mechanism for a height of each of the electronic circuit boards 112 will be described with reference to FIG. 3 and FIG. 12. FIG. 12 is a side view of the main part of the sensor device 100 according to the present embodiment.

In the present embodiment, in order to accurately measure the depression amount of each of the keys 302, it is important to appropriately set a distance between a lower surfaces of the key 302 and the photoreflector sensor 114. Thus, in the present embodiment, in order to adjust the height of the photoreflector sensor 114, one or a plurality of adjustment plates (height adjustment plates) 150 may be provided between the electronic circuit board 112 and the main frame 110 as illustrated in FIG. 3, or an adjustment plate 150 may be provided as illustrated in FIG. 12. Furthermore, in the present embodiment, the adjustment plates 150 having various thicknesses may be prepared. As described above, in the present embodiment, by providing the adjustment plate 150 between the electronic circuit board 112 and the main frame 110, it is possible to appropriately adjust the distance between the lower surface of the key 302 and the photoreflector sensor 114.

As described above, in the present embodiment, since the sensor device 100 is fixed to the action mechanism by sandwiching of the beam 300 between the side surface portion 138 of the clamp mechanism 130 and the screws 132, processing such as making a hole in the element included in the action mechanism is not performed. In addition, in the present embodiment, since it is possible to rotate the screw 132 according to the width of the beam 300 and to sandwich the beam 300 between the side surface portion 138 and the screw 132, and it is possible to avoid applying excessive force to the beam 300 of the action mechanism. In addition, in the present embodiment, by sandwiching the connection member 142 of the clamp mechanism 130 and the main frame 110 in the Z-axis direction by the fixing member 122 of the frame lock 120, it is possible to fix the main frame 110 to the clamp mechanism 130 fixed to the beam 300. Thus, according to the present embodiment, it is possible to fix the sensor device 100 without applying processing such as making a hole in the element included in the action mechanism. Furthermore, in the present embodiment, after the clamp mechanisms 130 are respectively attached to the beams 300, force for fixing the relative positions of the clamp mechanism 130 and the main frame 110 is applied by the frame lock 120. Thus, force that may deform the beams 300 or the like is not applied. As a result, according to the present embodiment, it is possible to avoid a change in the timbre of the acoustic piano.

In addition, in the present embodiment, since the relative positions of the main frame 110 and the clamp mechanism 130 are not limited and can be freely adjusted in fixation thereof, the clamp mechanism 130 and the main frame 110 can be fixed without being affected by the beam 300.

In addition, in the present embodiment, since each of the plurality of electronic circuit boards 112 is screwed to the main frame 110 by utilization of the long hole that is elongated in the X-axis direction, the position of the electronic circuit board 112 in the X-axis direction can be adjusted. Thus, according to the present embodiment, each of the keys 302 and each of the photoreflector sensors 114 can be adjusted in such a manner that the positions thereof are aligned. In addition, according to the present embodiment, by providing the one or plurality of adjustment plates 150 between each of the electronic circuit boards 112 and the main frame 110, it is possible to appropriately adjust the distance between the lower surface of the keys 302 and the photoreflector sensors 114.

That is, according to the sensor device 100 of the present embodiment, it is possible to easily perform attachment/detachment to/from the acoustic piano having no sensing function at the time of shipment without applying processing. Furthermore, the sensor device 100 can correspond to various acoustic pianos. Note that the configuration of the sensor device 100 according to the present embodiment is not limited to the configuration illustrated in the drawings.

3. SECOND EMBODIMENT

<3.1 Detailed Configuration>

Figure 13:
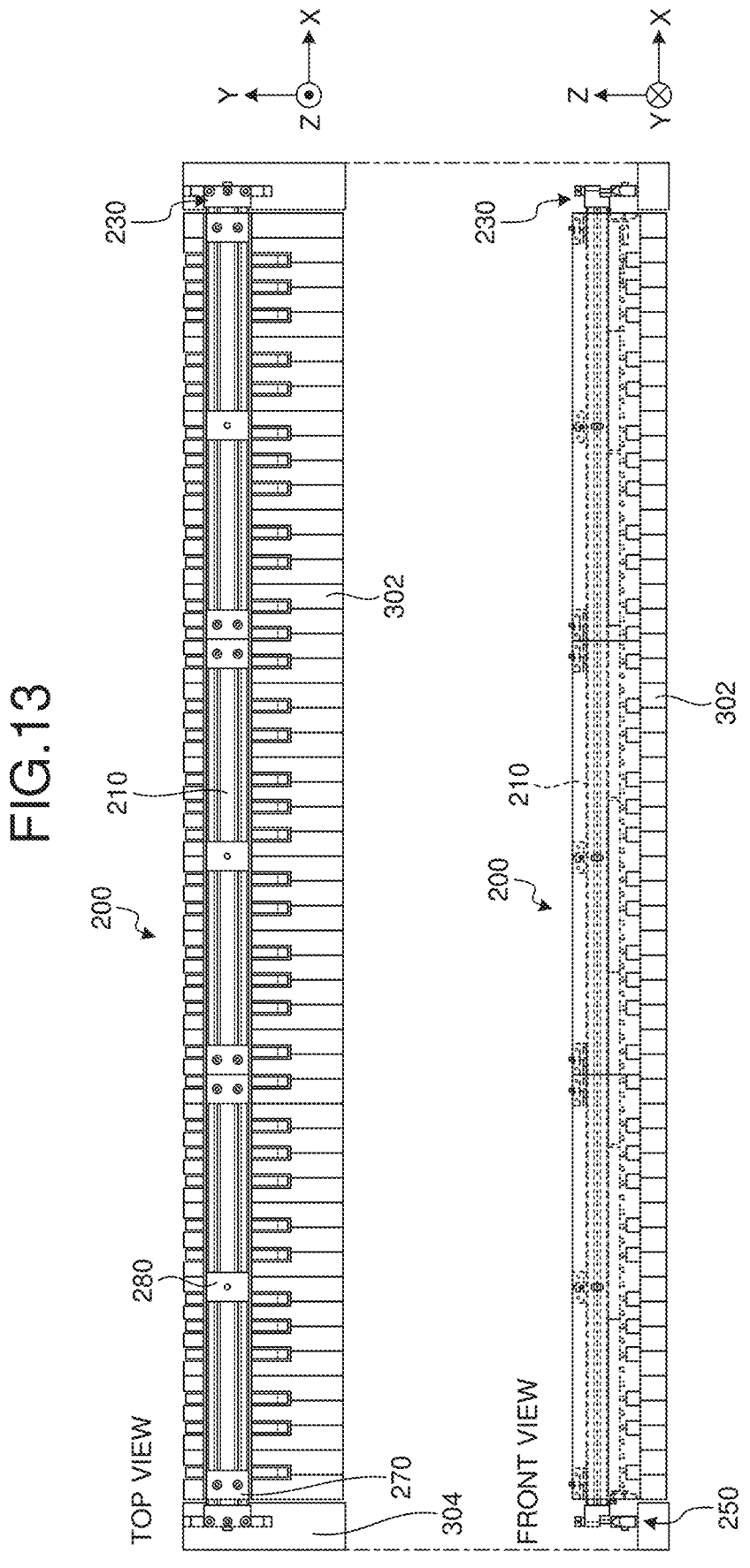
FIG. 13 is a top view and a side view of a sensor device 200 according to a second embodiment of the present disclosure.
Figure 14:
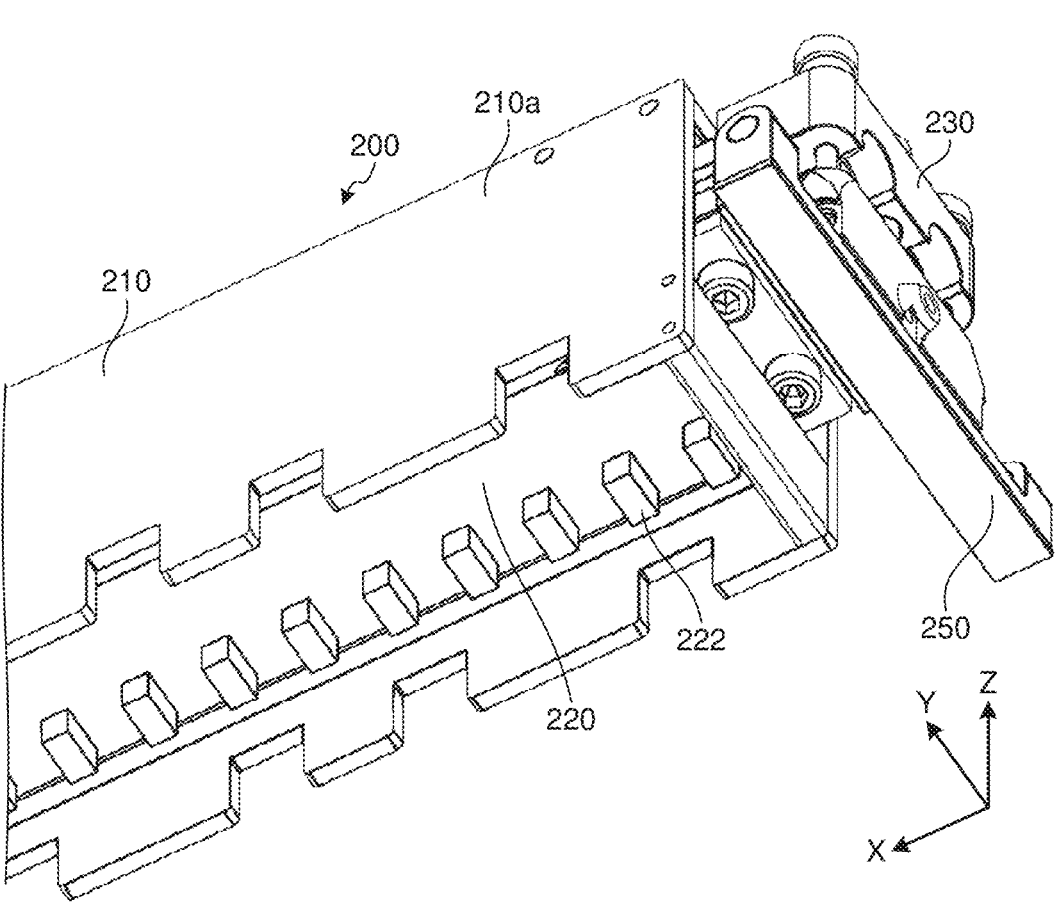
FIG. 14 is a perspective view of a main part of the sensor device 200 according to the second embodiment of the present disclosure.
Figure 15:
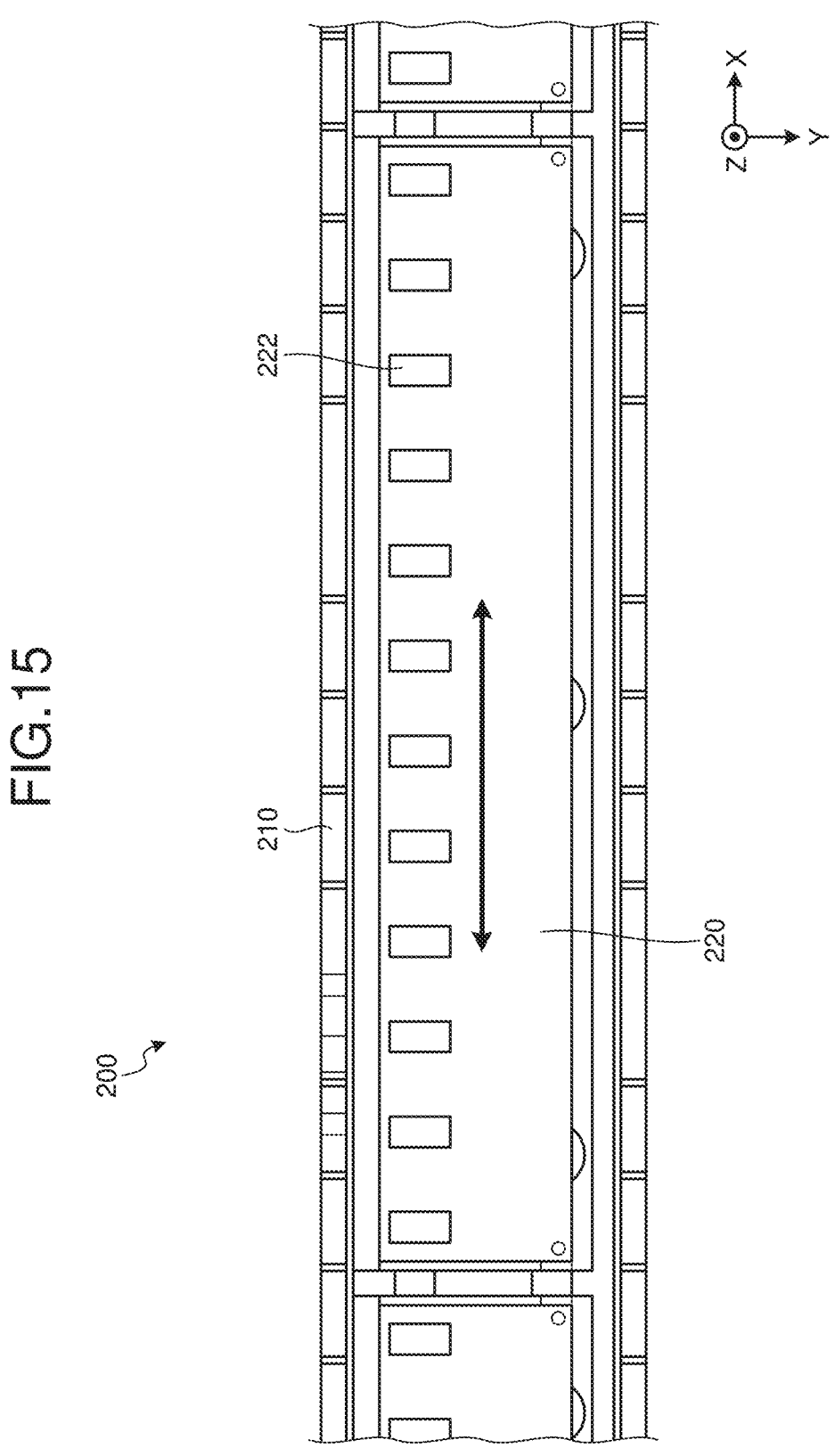
FIG. 15 is a top view of the main part of the sensor device 200 according to the second embodiment of the present disclosure.
Figure 16:
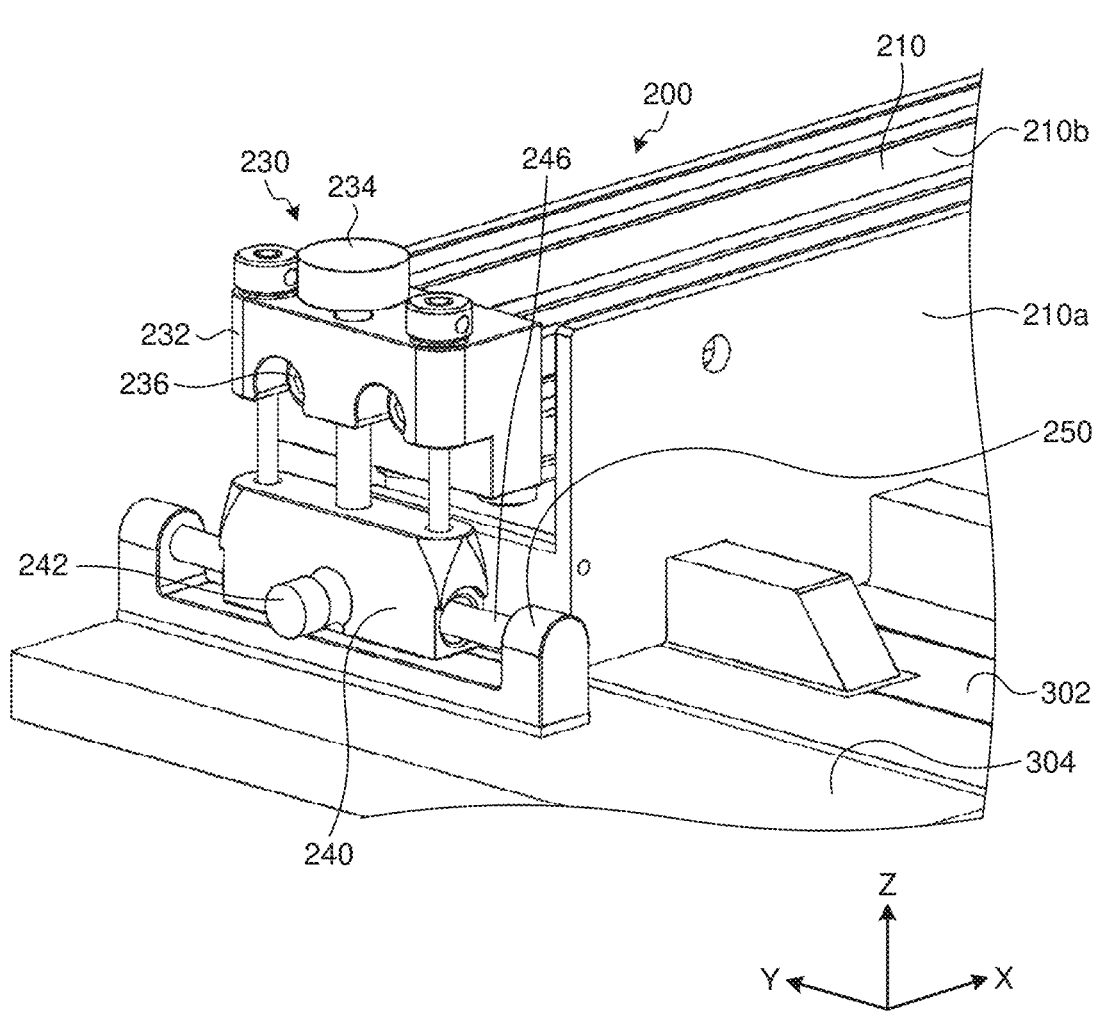
FIG. 16 is a perspective view of an adjustment mechanism 230 according to the second embodiment of the present disclosure.
Figure 17:
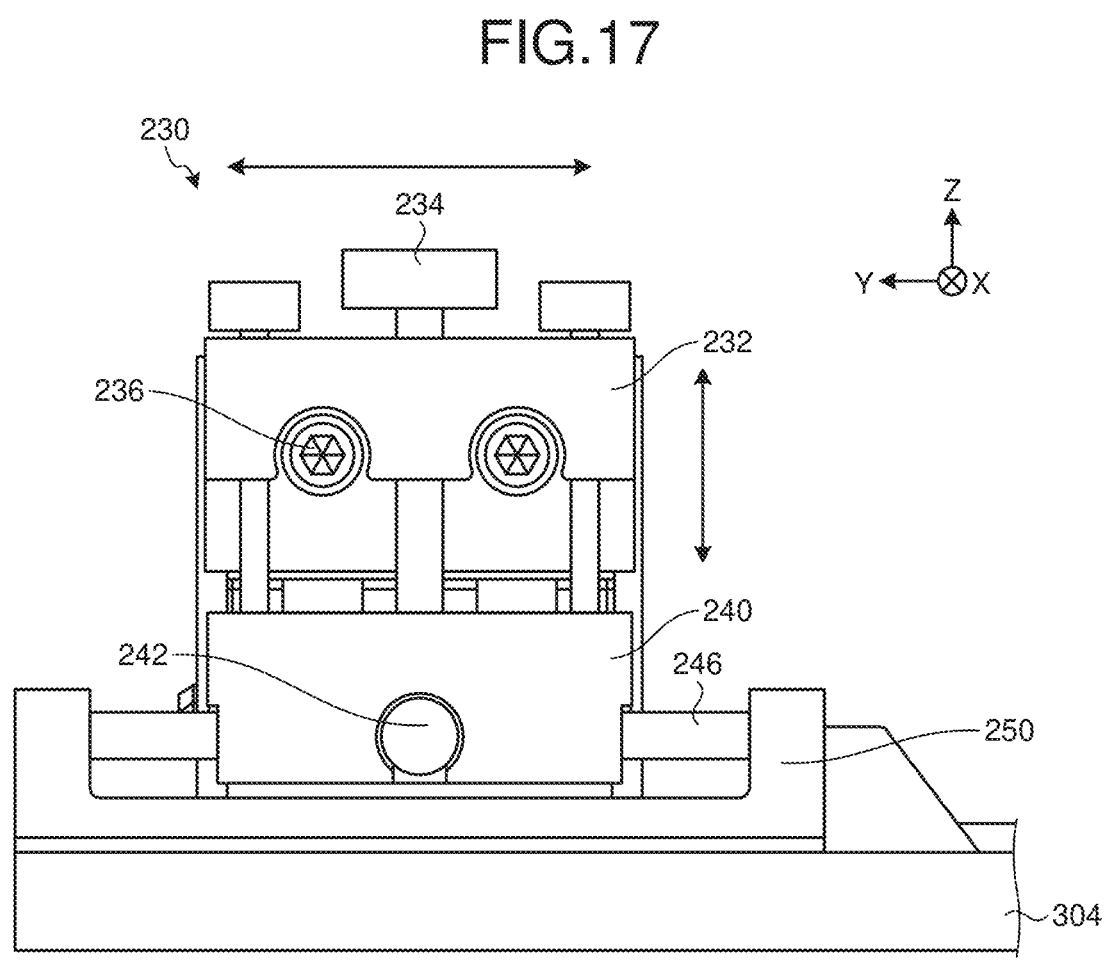

Next, as a second embodiment of the present disclosure, a sensor device (key depression amount sensor device) that is installed above keys of a piano and detects a depression amount of each of the keys will be described. A detailed configuration of a sensor device 200 of the present embodiment will be described with reference to FIG. 13 to FIG. 17. FIG. 13 is a top view (upper part of FIG. 13) and a side view (lower part of FIG. 13) of the sensor device 200 according to the present embodiment. FIG. 14 is a perspective view of a main part of the sensor device 200 according to the present embodiment, and FIG. 15 is a top view of the main part of the sensor device 200 according to the present embodiment. FIG. 16 is a perspective view of an adjustment mechanism 230 according to the present embodiment, and FIG. 17 is a side view of the adjustment mechanism 230 according to the present embodiment.

In the first embodiment of the present disclosure described above, since the sensor device 100 needs to be installed in the action mechanism after the action mechanism is pulled out from the piano, it can be said that the installation is troublesome. On the other hand, in the present embodiment, since the sensor device 200 can be installed above keys 302 of a piano which keys are struck by a player, an action mechanism is not pulled out, whereby installation can be easily performed. Note that the second embodiment will be described with a case where application to an acoustic piano is performed being an example. However, the sensor device 200 of the present embodiment is not necessarily applied to the acoustic piano, and can be applied to a digital piano since being able to be installed above the keys 302.

Specifically, as illustrated in FIG. 13, the sensor device 200 according to the present embodiment includes a housing 210 that houses a plurality of electronic circuit boards 220, each of which includes a plurality of photoreflector sensors 222 to respectively detect depression amounts of the keys 302 by reflection of light, and that blocks light from the outside. Furthermore, the sensor device 200 includes a pair of fixing portions 250 that fixes the housing 210 above the keys 302, and a pair of adjustment mechanisms 230 that adjusts a position of the housing 210 in a Z-axis direction and a Y-axis direction. Hereinafter, details of each element of the sensor device 200 according to the present embodiment will be sequentially described.

(Housing 210)

As illustrated in FIG. 13 and FIG. 14, the housing 210 has a pair of side plates 210a that is parallel to a plane including a Z axis and an X axis and extends along the X axis. The housing 210 has a frame member 210b that extends in the X-axis direction and is sandwiched between the pair of side plates 210a in the Y-axis direction. For example, the housing 210 is formed of a resin material capable of blocking light. Specifically, in the present embodiment, for example, the pair of side plates 210a is connected by connection members 270 and 280, and the frame member 210b is connected to the pair of side plates 210a via the connection members 270 and 280 in such a manner as to be sandwiched between the pair of side plates 210a. In the present embodiment, for example, an end surface of the frame member 210b is provided with a plurality of holes (fifth hole portions) extending in the X-axis direction, and is screwed to the adjustment mechanism 230 (described later) by screws 236 (see FIG. 16) penetrating the holes.

As illustrated in FIG. 14, the housing 210 houses the plurality of electronic circuit boards 220, each of which includes the plurality of photoreflector sensors 222, inside. Specifically, the plurality of electronic circuit boards 220 is fixed to a back surface of the frame member 210b of the housing 210.

Furthermore, similarly to the first embodiment, also in the present embodiment, the plurality of photoreflector sensors 222, an electronic circuit for measurement, and an electronic component (not illustrated) are mounted on each of the electronic circuit boards 220. Specifically, also in the present embodiment, on each of the electronic circuit boards 220, the plurality of photoreflector sensors 222 is arranged at predetermined intervals in the X-axis direction in accordance with a position of each of the keys 302. More specifically, the sensor device 200 according to the present embodiment is installed in such a manner that one photoreflector sensor 222 is positioned above each of the keys (white key and black key) 302. Note that the present embodiment is not limited to use the photoreflector sensors 222, and an optical sensor such as a ToF sensor capable of measuring a distance to a key may be used.

In the present embodiment, the housing 210 of the sensor device 200 includes the plurality of electronic circuit boards 220 arranged in the X-axis direction. Also in the present embodiment, as illustrated in FIG. 15, the electronic circuit boards 220 in each of which the 12 photoreflector sensors 222 are arranged in the X-axis direction at predetermined intervals in such a manner as to respectively correspond to the 12 keys 302 are prepared. Furthermore, in the present embodiment, the electronic circuit board 220 in which the 16 photoreflector sensors 222 are arranged in the X-axis direction at predetermined intervals in such a manner as to respectively correspond to the 16 keys 302 is also prepared. Also in the present embodiment, the six electronic circuit boards 220 each of which includes the 12 photoreflector sensors 222 as described above and the one electronic circuit board 220 that includes the 16 photoreflector sensors 222 as described above are prepared, whereby it is possible to cover all the 88 keys 302 of the piano.

Although the 12 photoreflector sensors 222 corresponding to the keys 302 for one octave are provided on each of the electronic circuit boards 220 for convenience in the present embodiment, the present embodiment is not limited to such an embodiment. For example, a plurality of photoreflector sensors 222 the number of which is other than 12 and 16 may be provided on an electronic circuit board 220, and the number of electronic circuit boards 220 included in the housing 210 may be other than 7, and is not specifically limited.

That is, in the present embodiment, the plurality of electronic circuit boards 220 each of which includes the predetermined number of photoreflector sensors 222 is prepared instead of one electronic circuit board 220 having a plurality of photoreflector sensors 222 that covers all the 88 keys 302. In such a manner, also in the present embodiment, it is possible to correspond to the keys 302 having different positions and widths.

Specifically, also in the present embodiment, a long hole (long hole portion) (not illustrated) penetrating the frame member 210b and elongated in the X-axis direction may be provided in the frame member 210b of the housing 210. Furthermore, a hole penetrating the electronic circuit board 220 may also be provided on a side of the electronic circuit board 220. Also in the present embodiment, each of the electronic circuit boards 220 is fixed to the housing 210 by being screwed by a screw (third screw member) (not illustrated) penetrating the long hole and the hole. Thus, also in the present embodiment, one of the holes penetrated by the screw is made to be the long hole extending in the X-axis direction, whereby it is possible to adjust the position of the electronic circuit board 220 in the X-axis direction. Note that in the present embodiment, the side of the housing 210 is not limited to be the long hole, and the side of the electronic circuit board 220 may be a long hole.

(Fixing Portion 250)

As illustrated in FIG. 13, the pair of fixing portions 250 is provided in such a manner as to sandwich the housing 210 in the X-axis direction, and respectively placed in spaces 304 next to the keys 302, for example, as illustrated in the lower part of FIG. 13 and FIG. 16 and FIG. 17. Thus, the sensor device 200 can be installed on the piano. In the present embodiment, by installing the fixing portions 250 respectively in the spaces 304 next to the keys 302, it is possible to install the sensor device 200 above the plurality of keys 302 without hindering movement of the keys 302 and without applying processing on the piano, or the like.

In addition, as illustrated in FIG. 16 and FIG. 17, each of the fixing portions 250 has a substantially U shape opened upward or a substantially U shape bent at a right angle. Furthermore, each of the fixing portions 250 supports a lower member 240 of the adjustment mechanism 230 (described later) via a shaft (third rod-shaped member) 246 sandwiched between both ends thereof. The fixing portion 250 is connected to the adjustment mechanism 230 by the shaft 246. For example, the fixing portion 250 is formed of a metal material, a resin material, or the like.

(Adjustment Mechanism 230)

Also in the present embodiment, similarly to the first embodiment, it is important to accurately adjust a position of the photoreflector sensors 222 with respect to the keys 302 for high measurement resolution, stable measurement, and versatility. However, since a position and size of the keys 302 vary depending on a piano manufacturer and a model, it is required to accurately adjust the position of the photoreflector sensors 222 according to each thereof. Thus, in the present embodiment, the adjustment mechanisms 230 can adjust a position of the housing 210 (specifically, the electronic circuit boards 220) in the Y-axis direction and the Z-axis direction.

As illustrated in FIG. 16 and FIG. 17, each of the adjustment mechanisms 230 includes an upper member 232 coupled to the housing 210 and the lower member 240 positioned below the upper member. The adjustment mechanism 230 is formed of, for example, a metal material.

The upper member 232 includes a hole (third hole portion) penetrating the upper member 232 in the Z-axis direction, and a screw (second screw member) 234 engaged with a groove provided in an inner surface of the hole and having a tip portion fixed to an upper surface of the lower member 240. The upper member 232 and the end surface of the frame member 210b of the housing 210 are provided with a plurality of holes (fifth and sixth holes) extending in the X-axis direction, and are screwed and connected to each other by screws (third rod-shaped members) 236 penetrating the holes. Then, when the screw 234 is turned, the upper member 232 can move in the Z-axis direction. Accordingly, the frame member 210b of the housing 210 also moves in the Z-axis direction. Thus, in the present embodiment, the Z-axis direction (height direction) of the housing 210, that is, the distance between the keys 302 and the photoreflector sensors 222 can be accurately adjusted.

In addition, the lower member 240 has a hole (fourth hole portion) (not illustrated) penetrating the lower member 240 in the Y-axis direction, and a shaft 246 penetrating the hole and sandwiched inside the fixing portions 250. In the present embodiment, the lower member 240 movement of which is limited to the Y-axis direction by the shaft 246 is moved in the Y-axis direction, whereby the upper member 232 also moves in the Y-axis direction. As a result, in the present embodiment, the housing 210 (specifically, the electronic circuit boards 220) can be also moved in the Y-axis direction. Specifically, the measurement resolution can be adjusted by adjustment of the position of the photoreflector sensors 222 in the Y-axis direction on each of the electronic circuit boards 220. Since the depression amounts of the keys 302 are larger in front of a player, the resolution of the photoreflector sensors 222 is higher when the sensor device 200 is installed in such a manner that the photoreflector sensors 222 are positioned on a front side of the player. However, when the sensor device 200 is installed in front of the player, it becomes an obstacle to the performance. Thus, in the present embodiment, it is preferable to adjust the position of the sensor device 200 in the Y-axis direction according to the piano or the player.

<3.2 Light Blocking Function>

Figure 18:
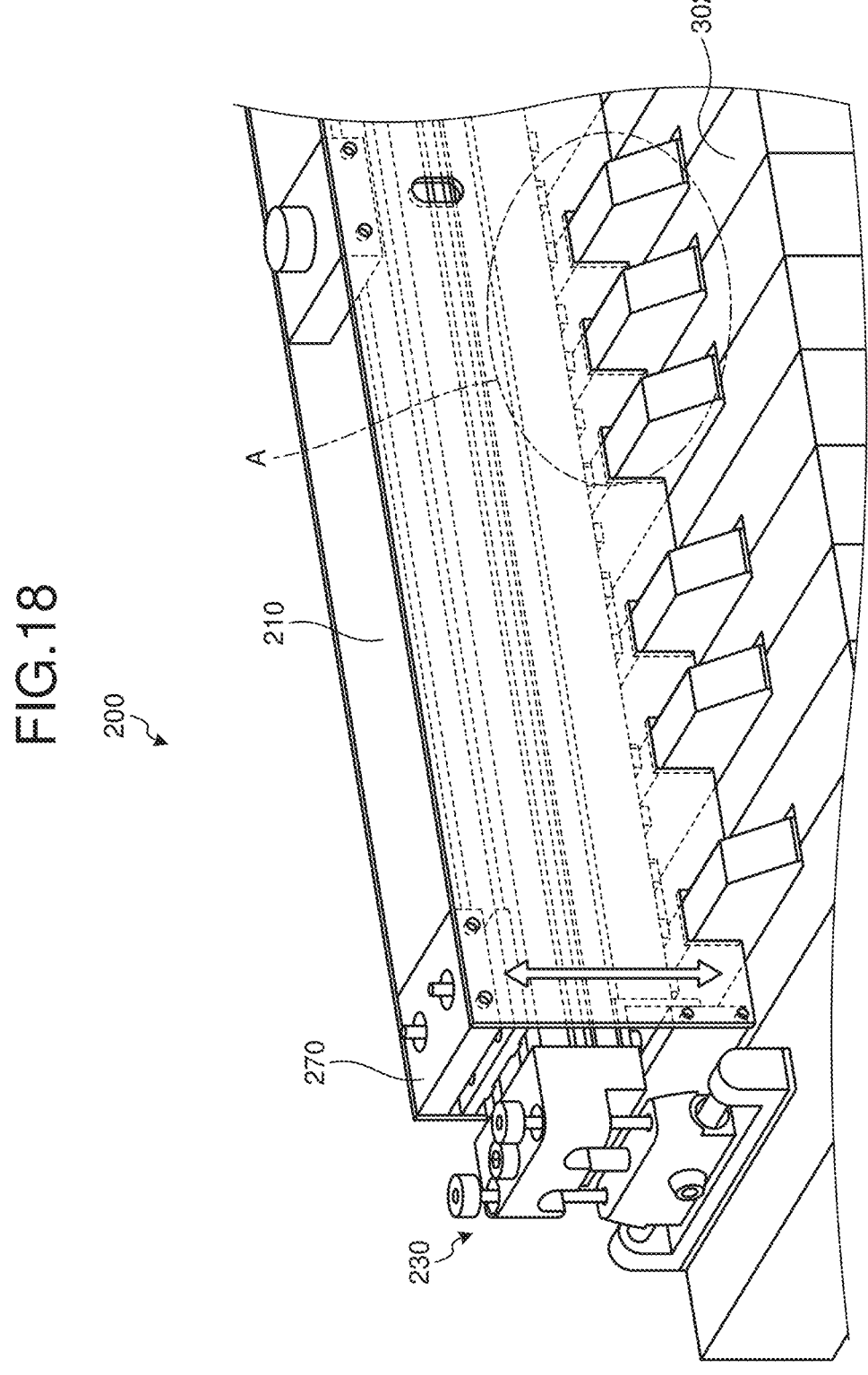
FIG. 18 is a perspective view of a housing 210 according to the second embodiment of the present disclosure.

Next, details of a light blocking mechanism in the present embodiment will be described with reference to FIG. 18 and FIG. 19. FIG. 18 is a perspective view of the housing 210 according to the present embodiment, and FIG. 19 is an enlarged view of a main part of the housing 210 according to the present embodiment, the main part surrounded by a broken line circle A in FIG. 18 being enlarged in the enlarged view.

As described above, each of the photoreflector sensors 222 measures a depression amount of one of the keys 302 by measuring an amount of infrared light that is infrared light from a light emitting element of the photoreflector sensor 222 being reflected on an upper surface of the key 302 and reflected on a light receiving element of the photoreflector sensor 222. However, since sunlight, light from an incandescent lamp, and the like also include infrared light, there is a concern that an infrared light component (ambient light) from an external environment other than the light emitting element of the photoreflector sensor 222 itself adversely affects measurement by the light receiving element of the photoreflector sensor 222.

Thus, in the present embodiment, the housing 210 is provided to block the above-described ambient light. That is, although the housing 210 covers the photoreflector sensors 222 facing the keys 302, the covering should not interfere with the movement of the keys 302. Thus, in the present embodiment, a plurality of recess portions 210c (see FIG. 19) is provided at a lower end of the side plate 210a on a side of the player of the housing 210 in such a manner that it is possible to block ambient light without disturbing the movement of the keys 302.

Figure 19:
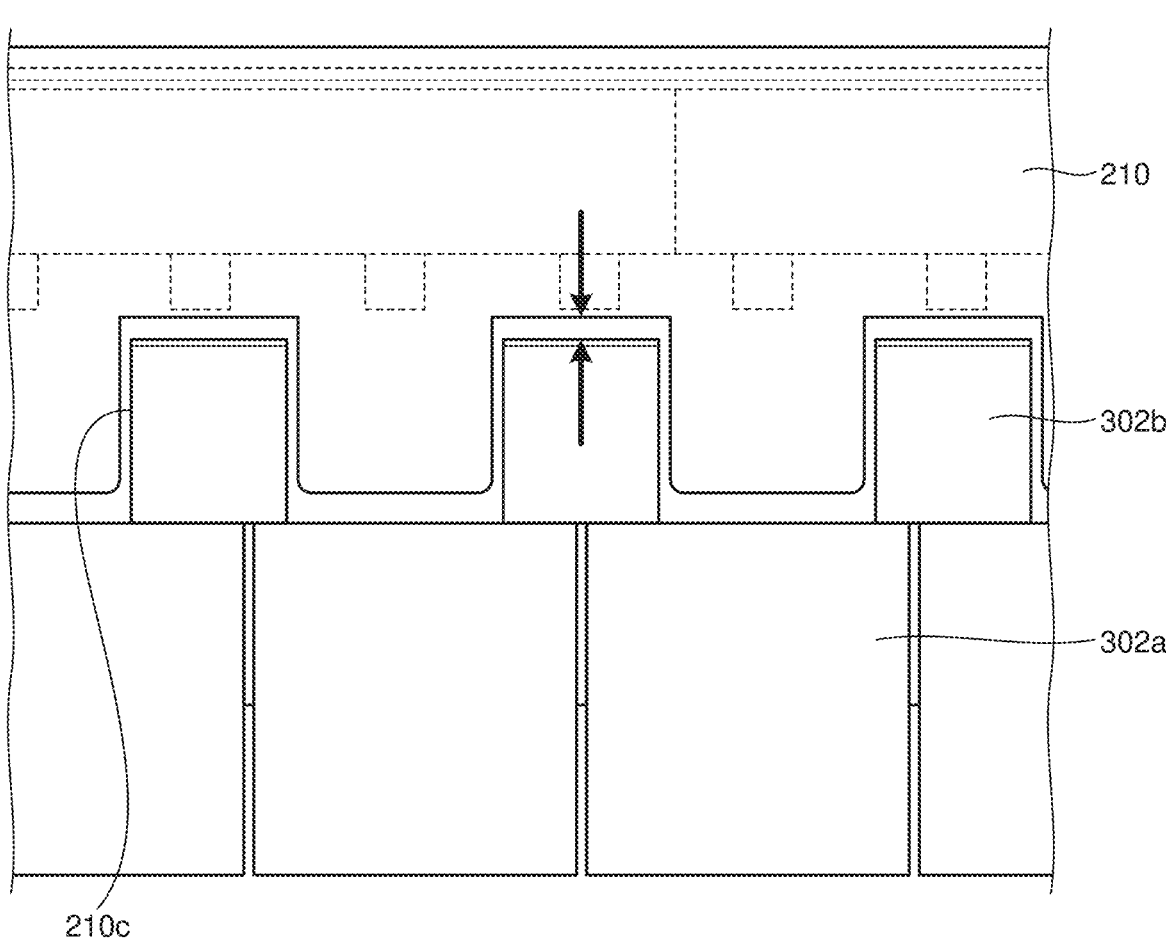
FIG. 19 is an enlarged view of a main part of the housing 210 according to the second embodiment of the present disclosure.

Specifically, as illustrated in FIG. 18 and FIG. 19, the lower end of the side plate 210a on the side of the player of the housing 210 has the plurality of recess portions 210c arranged in the X-axis direction at predetermined intervals. The plurality of recess portions 210c engages with a plurality of black keys 302b protruding upward compared with white key 302a with a predetermined gap. Furthermore, in order to prevent the ambient light from the outside from entering the housing 210 enclosing the electronic circuit boards 220 on which the photoreflector sensors 222 are mounted, it is preferable that the gap is as narrow as possible without disturbing the movement of the black keys 302b. Thus, in the present embodiment, the gap is accurately adjusted by the adjustment of the position of the housing 210 in the Z-axis direction by the above-described adjustment mechanisms 230. For example, the adjustment mechanisms 230 can adjust the gap to about a several mm or less.

As described above, according to the present embodiment, since the sensor device 200 can be installed above the keys 302 of the piano which keys are struck by the player, the action mechanism is not pulled out, whereby installation can be easily performed. In addition, in the present embodiment, by installing the fixing portions 250 in the spaces 304 next to the keys 302, it is possible to install the sensor device 200 above the plurality of keys 302 without hindering the movement of the keys 302 and without applying processing on the piano, or the like. As a result, according to the present embodiment, it is possible to avoid a change in timbre of the acoustic piano, for example.

In addition, in the present embodiment, since each of the plurality of electronic circuit boards 220 is screwed to the housing 210 by utilization of the long hole that is elongated in the X-axis direction, the position of the electronic circuit boards 220 in the X-axis direction can be adjusted. Thus, according to the present embodiment, each of the keys 302 and each of the photoreflector sensors 222 can be adjusted in such a manner that the positions thereof are aligned. In addition, according to the present embodiment, since the position of the housing 210 (specifically, the electronic circuit boards 220) in the Y-axis direction and the Z-axis direction can be adjusted by the adjustment mechanisms 230, the position of the photoreflector sensors 222 with respect to the keys 302 can be accurately adjusted even when the position and size of the keys 302 are different.

That is, according to the sensor device 200 of the present embodiment, it is possible to easily perform attachment/detachment to/from the piano having no sensing function at the time of shipment without applying processing. Furthermore, the sensor device 200 can correspond to various pianos. Note that the configuration of the sensor device 200 according to the present embodiment is not limited to the configuration illustrated in the drawings.

4. CONCLUSION

As described above, according to the embodiments of the present disclosure, it is possible to provide the sensor devices (key depression amount sensor devices) 100 and 200 that can be easily attached to and detached from the piano having no sensing function at the time of shipment without application of processing, and that have high versatility.

5. SUPPLEMENTARY NOTE

Preferred embodiments of the present disclosure have been described in detail in the above with reference to the accompanying drawings. However, a technical scope of the present disclosure is not limited to such examples. It is obvious that a person having ordinary knowledge in the technical field of the present disclosure can conceive various alterations or modifications within the scope of the technical idea described in claims, and it should be understood that these alterations or modifications naturally belong to the technical scope of the present disclosure.

In addition, the effects described in the present specification are merely illustrative or exemplary, and are not restrictive. That is, in addition to the above effects or instead of the above effects, the technology according to the present disclosure can exhibit a different effect obvious to those skilled in the art from the description of the present specification.

Note that the present technology can also have the following configurations.

(1) A key depression amount sensor device that is installed below keys of a piano, which keys are aligned along a longitudinal axis, and that detects a depression amount of each of the keys, the key depression amount sensor device comprising:

an electronic circuit board including a plurality of optical sensors that respectively detects the depression amounts of the keys by reflection of light;

a housing that extends along the longitudinal axis and houses the electronic circuit board;

a clamp mechanism that sandwiches an action beam, which is positioned below the keys, in a longitudinal axis direction; and a connection mechanism that connects the clamp mechanism and the housing, wherein the housing includes a pair of side plates extending in the longitudinal axis direction, and a bottom plate that is coupled to the pair of side plates, extends along the longitudinal axis, and supports the electronic circuit board, the connection mechanism includes a fixing member that supports the housing, a first rod-shaped member that penetrates a first hole portion provided in a bottom surface of the fixing member and pushes up the bottom plate of the housing to an upper side, and protrusion portions that are provided on the fixing member, and respectively come into contact with upper ends of the side plates of the housing and push down the housing, the clamp mechanism includes a frame member that includes a pair of side surface portions extending in a vertical direction, and an upper surface portion coupled to the pair of side surface portions and parallel to a horizontal plane, a connection member coupled to one of the side surface portions and sandwiched between the fixing member and the bottom plate, and a second rod-shaped member that penetrates a second hole portion provided in the one side surface portion and engages with a groove provided in an inner surface of the second hole portion, the upper surface portion is placed on the action beam, and the housing is fixed on the action beam by sandwiching of the action beam between other one of the side surface portions and a tip portion of the second rod-shaped member.

(2) The key depression amount sensor device according to (1), wherein the first rod-shaped member is a screw that engages with a groove inside the first hole portion.

(3) The key depression amount sensor device according to (2), wherein a biasing member or an elastic body is provided at a tip of the first rod-shaped member.

(4) The key depression amount sensor device according to any one of (1) to (3), wherein the fixing member of the connection mechanism has a substantially U-shaped cross section opened upward, and the protrusion portions are provided at upper end portions of the fixing member.

(5) The key depression amount sensor device according to any one of (1) to (4), wherein the second rod-shaped member is a screw that engages with a groove inside the second hole portion.

(6) The key depression amount sensor device according to any one of (1) to (4), wherein the second rod-shaped member includes a biasing member.

(7) The key depression amount sensor device according to any one of (1) to (6), wherein the tip portion of the second rod-shaped member has a flat plate member in contact with a side surface of the action beam.

(8) The key depression amount sensor device according to any one of (1) to (7), further comprising a plurality of the connection mechanisms, and plurality of the clamp mechanisms.

(9) The key depression amount sensor device according to any one of (1) to (8), wherein the electronic circuit board is arranged along the longitudinal axis and is fixed to the bottom plate of the housing by being screwed with a first screw member, and the first screw member penetrates a long hole portion that is provided in the electronic circuit board or the bottom plate of the housing and that is elongated along the longitudinal axis.

(10) The key depression amount sensor device according to any one of (1) to (9), further comprising a height adjustment plate installed between the electronic circuit board and the housing.

(11) A key depression amount sensor device that is installed above keys of a piano, which keys are aligned along a longitudinal axis, and that detects a depression amount of each of the keys, the key depression amount sensor device comprising:

an electronic circuit board including a plurality of optical sensors that respectively detects the depression amounts of the keys by reflection of light;

a housing that houses the electronic circuit board and blocks light from an outside;

a pair of fixing portions that fixes the housing above the keys; and a pair of adjustment mechanisms that adjusts a position of the housing in a vertical direction and a lateral axis direction perpendicular to the longitudinal axis on a horizontally extending plane, wherein each of the fixing portions has a substantially U shape opened upward and supports one of the adjustment mechanisms via a third rod-shaped member sandwiched by the fixing portion, each of the adjustment mechanisms includes an upper member connected to the housing, and a lower member positioned below the upper member, the upper member includes a third hole portion penetrating the upper member in the vertical direction, and a second screw member that engages with a groove provided in an inner surface of the third hole portion and has one end portion connected to an upper surface of the lower member, and the lower member includes a fourth hole portion penetrating the lower member along a lateral axis, and the third rod-shaped member that penetrates the fourth hole portion and is sandwiched inside the fixing portion.

(12) The key depression amount sensor device according to (11), wherein the housing includes a pair of side plates extending in a longitudinal axis direction, and a frame member sandwiched between the pair of side plates and extending along the longitudinal axis.

(13) The key depression amount sensor device according to (12), wherein the housing is formed of a blocking member that blocks light.

(14) The key depression amount sensor device according to (12) or (13), wherein a lower end of one of the side plates of the housing has a plurality of recess portions arranged along the longitudinal axis at predetermined intervals, and the plurality of recess portions engages with a plurality of black keys with a predetermined gap.

(15) The key depression amount sensor device according to any one of (12) to (14), wherein the electronic circuit board is arranged along the longitudinal axis and is fixed to the frame member of the housing by being screwed with a third screw member, and the third screw member penetrates a long hole portion that is provided in the electronic circuit board or the frame member of the housing and that is elongated along the longitudinal axis.

(16) The key depression amount sensor device according to any one of (1) to (15), further comprising a plurality of the electronic circuit boards.

(17) The key depression amount sensor device according to any one of (1) to (16), wherein the optical sensors are photoreflector sensors.

(18) The key depression amount sensor device according to any one of (1) to (17), wherein the plurality of optical sensors is arranged on the electronic circuit board at predetermined intervals along the longitudinal axis.

REFERENCE SIGNS LIST 100, 200 SENSOR DEVICE
110 MAIN FRAME
110a, 210a SIDE PLATE
110b BOTTOM PLATE
112, 220 ELECTRONIC CIRCUIT BOARD
114, 222 PHOTOREFLECTOR SENSOR
116 LONG HOLE
118, 124, 132, 234, 236 SCREW
120 FRAME LOCK
122 FIXING MEMBER
122a PROTRUSION PORTION
130 CLAMP MECHANISM
132a FLAT PLATE MEMBER
134, 138 SIDE SURFACE PORTION
136 UPPER SURFACE PORTION
142, 270, 280 CONNECTION MEMBER
150 ADJUSTMENT PLATE
210 HOUSING
210b FRAME MEMBER
210c RECESS PORTION
230 ADJUSTMENT MECHANISM
232 UPPER MEMBER

240 LOWER MEMBER
246 SHAFT
250 FIXING PORTION
300 BEAM
302 KEY
302a WHITE KEY
302b BLACK KEY
304 SPACE

The invention claimed is:

1. A key depression amount sensor device that is installed below keys of a piano, which keys are aligned along a longitudinal axis, and that detects a depression amount of each of the keys, the key depression amount sensor device comprising:

an electronic circuit board including a plurality of optical sensors that respectively detects the depression amounts of the keys by reflection of light;

a housing that extends along the longitudinal axis and houses the electronic circuit board;

a clamp mechanism that sandwiches an action beam, which is positioned below the keys, in a longitudinal axis direction; and a connection mechanism that connects the clamp mechanism and the housing, wherein the housing includes a pair of side plates extending in the longitudinal axis direction, and a bottom plate that is coupled to the pair of side plates, extends along the longitudinal axis, and supports the electronic circuit board, the connection mechanism includes a fixing member that supports the housing, a first rod-shaped member that penetrates a first hole portion provided in a bottom surface of the fixing member and pushes up the bottom plate of the housing to an upper side, and protrusion portions that are provided on the fixing member, and respectively come into contact with upper ends of the side plates of the housing and push down the housing, the clamp mechanism includes a frame member that includes a pair of side surface portions extending in a vertical direction, and an upper surface portion coupled to the pair of side surface portions and parallel to a horizontal plane, a connection member coupled to one of the side surface portions and sandwiched between the fixing member and the bottom plate, and a second rod-shaped member that penetrates a second hole portion provided in the one side surface portion and engages with a groove provided in an inner surface of the second hole portion, the upper surface portion is placed on the action beam, and the housing is fixed on the action beam by sandwiching of the action beam between other one of the side surface portions and a tip portion of the second rod-shaped member.

2. The key depression amount sensor device according to claim 1, wherein the first rod-shaped member is a screw that engages with a groove inside the first hole portion.

3. The key depression amount sensor device according to claim 2, wherein a biasing member or an elastic body is provided at a tip of the first rod-shaped member.

4. The key depression amount sensor device according to claim 1, wherein the fixing member of the connection mechanism has a substantially U-shaped cross section opened upward, and the protrusion portions are provided at upper end portions of the fixing member.

5. The key depression amount sensor device according to claim 1, wherein the second rod-shaped member is a screw that engages with a groove inside the second hole portion.

6. The key depression amount sensor device according to claim 1, wherein the second rod-shaped member includes a biasing member.

7. The key depression amount sensor device according to claim 1, wherein the tip portion of the second rod-shaped member has a flat plate member in contact with a side surface of the action beam.

8. The key depression amount sensor device according to claim 1, further comprising a plurality of the connection mechanisms, and a plurality of the clamp mechanisms.

9. The key depression amount sensor device according to claim 1, wherein the electronic circuit board is arranged along the longitudinal axis and is fixed to the bottom plate of the housing by being screwed with a first screw member, and the first screw member penetrates a long hole portion that is provided in the electronic circuit board or the bottom plate of the housing and that is elongated along the longitudinal axis.

10. The key depression amount sensor device according to claim 1, further comprising a height adjustment plate installed between the electronic circuit board and the housing.

11. The key depression amount sensor device according to claim 1, further comprising a plurality of the electronic circuit boards.

12. The key depression amount sensor device according to claim 1, wherein the optical sensors are photoreflector sensors.

13. The key depression amount sensor device according to claim 1, wherein the plurality of optical sensors is arranged on the electronic circuit board at predetermined intervals along the longitudinal axis.

14. A key depression amount sensor device that is installed above keys of a piano, which keys are aligned along a longitudinal axis, and that detects a depression amount of each of the keys, the key depression amount sensor device comprising:

an electronic circuit board including a plurality of optical sensors that respectively detects the depression amounts of the keys by reflection of light;

a housing that houses the electronic circuit board and blocks light from an outside;

a pair of fixing portions that fixes the housing above the keys; and a pair of adjustment mechanisms that adjusts a position of the housing in a vertical direction and a lateral axis direction perpendicular to the longitudinal axis on a horizontally extending plane, wherein each of the fixing portions has a substantially U shape opened upward and supports one of the adjustment mechanisms via a first rod-shaped member sandwiched by the fixing portion, each of the adjustment mechanisms includes an upper member connected to the housing, and a lower member positioned below the upper member, the upper member includes a first hole portion penetrating the upper member in the vertical direction, and a first screw member that engages with a groove provided in an inner surface of the first hole portion and has one end portion connected to an upper surface of the lower member, and the lower member includes a second hole portion penetrating the lower member along a lateral axis, and the first rod-shaped member that penetrates the second hole portion and is sandwiched inside the fixing portion.

15. The key depression amount sensor device according to claim 14, wherein the housing includes a pair of side plates extending in a longitudinal axis direction, and a frame member sandwiched between the pair of side plates and extending along the longitudinal axis.

16. The key depression amount sensor device according to claim 15, wherein the housing is formed of a blocking member that blocks light.

17. The key depression amount sensor device according to claim 15, wherein a lower end of one of the side plates of the housing has a plurality of recess portions arranged along the longitudinal axis at predetermined intervals, and the plurality of recess portions engages with a plurality of black keys with a predetermined gap.

18. The key depression amount sensor device according to claim 15, wherein the electronic circuit board is arranged along the longitudinal axis and is fixed to the frame member of the housing by being screwed with a second screw member, and the second screw member penetrates a long hole portion that is provided in the electronic circuit board or the frame member of the housing and that is elongated along the longitudinal axis.

\* \* \* \* \*